(12) United States Patent
Nakaoka

(10) Patent No.: US 6,335,902 B1
(45) Date of Patent: Jan. 1, 2002

(54) SEMICONDUCTOR MEMORY DEVICE PROVIDED WITH GENERATING MEANS FOR INTERNAL CLOCK SIGNAL FOR SPECIAL MODE

(75) Inventor: Yoshito Nakaoka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/618,751

(22) Filed: Jul. 18, 2000

(30) Foreign Application Priority Data

Jan. 20, 2000 (JP) .......................................... P2000-011683

(51) Int. Cl.[7] .................................................. G11C 8/00
(52) U.S. Cl. ...................... 365/233; 365/206; 365/189.05
(58) Field of Search ..................................... 365/233, 206, 365/189.05

(56) References Cited

U.S. PATENT DOCUMENTS

| | | | | |
|---|---|---|---|---|
| 5,410,507 A | * | 4/1995 | Tazunoki et al. | 365/189.09 |
| 5,835,448 A | * | 11/1998 | Ohtani et al. | 365/233 |
| 6,075,749 A | * | 6/2000 | Isa | 365/233 |
| 6,144,594 A | * | 11/2000 | McClure | 365/201 |
| 6,215,726 B1 | * | 4/2001 | Kubo | 365/233 |
| 6,246,614 B1 | * | 6/2001 | Ooshi | 365/191 |
| 6,252,820 B1 | * | 6/2001 | Nakamura | 365/233 |
| RE37,273 E | * | 7/2001 | Shinozaki | 365/233 |

FOREIGN PATENT DOCUMENTS

JP          11-191290          7/1999

* cited by examiner

Primary Examiner—Richard Elms
Assistant Examiner—Tuan T. Nguyen
(74) Attorney, Agent, or Firm—McDermott, Will & Emery

(57) ABSTRACT

A semiconductor memory device is provided for reducing or preventing any switching to a special mode from a normal mode operation due to noise on an external clock without affecting any access time of the semiconductor memory device. In the semiconductor memory device, input buffer amplifiers converts a plurality of external clock signals into a plurality of internal clock signals each having an internal signal level, respectively, and then, a control clock signal generating circuit generates a control clock signal for controlling an operation of the semiconductor memory device in accordance with the plurality of internal clock signals. At least one of special mode input buffer amplifiers and noise filters has a time response characteristic gently changing according to a change in an input signal, and generates an internal clock signal for a different special mode from a normal mode associated with either one of reading and writing of data from and in the semiconductor memory device in accordance with at least one of the plurality of external clock signals.

23 Claims, 19 Drawing Sheets

First Preferred Embodiment
Control Clock Signal Generating Circuit 1a

Fig.5 Fifth Preferred Embodiment
Control Clock Signal Generating Circuit 1e

Eleventh Preferred Embodiment
Control Clock Signal Generating Circuit 1k

Twelfth Preferred Embodiment
Control Clock Signal Generating Circuit 11

Normal Mode Input Buffer Amplifier 7

Special Mode Input Buffer Amplifier 8

Control Clock Generator 30a
Normal Mode(Normally, φ1= φ2="H")

Control Clock Generator 30b
$\overline{CAS}$ Before $\overline{RAS}$ Refresh Mode of Special Mode Read Operation in Normal Mode CbR Refresh Operation in Special Mode Occurrence of Noise in Read Operation

SEMICONDUCTOR MEMORY DEVICE PROVIDED WITH GENERATING MEANS FOR INTERNAL CLOCK SIGNAL FOR SPECIAL MODE

BACKGROUND OF THE INVENTION

1. Field of the Invention

The invention relates to a semiconductor memory device comprising generating means for generating an internal clock signal for special mode, in particular, a semiconductor memory device such as a clock asynchronous DRAM (Dynamic Random Access Memory) for generating an internal clock signal for a special mode other than a normal mode.

2. Description of the Related Art

FIG. 17 is a block diagram showing a configuration of a clock asynchronous DRAM 100 of the related art.

Referring to FIG. 17, the DRAM 100 comprises the following interface terminals with external circuits, exclusive of a power supply terminal and a ground terminal:

(a) a clock input terminal T1 for in putting an external clock signal for controlling each operation;

(b) an address input terminal T2 for inputting an address signal for addressing memory cell arrays 20-1, 20-2, 20-3 and 20-4; and (c) a data input and output terminal T3 for reading a data signal from the memory cell arrays 20-1 to 20-4 or writing data on the memory cell arrays 20-1 to 20-4.

Such external clock signals and external signals such as an the address signal, the data signal and the like are inputted to an internal circuit of the DRAM 100 through buffer amplifiers 2, 4, 5 and 6 and a clock generator 3.

First of all, the data signal is inputted to the data-in buffer amplifier 5. The data-in buffer amplifier 5 converts the data signal having a predetermined external signal level into the data signal having a predetermined internal signal level (having the same high level as the level of an operating power supply voltage supplied to the DRAM, namely, the so-called CMOS level). Then, the data-in buffer amplifier 5 writes the data signal having the internal signal level in the memory cell arrays 20-1 to 20-4 through sense refresh amplifiers and input and output controllers 23-1, 23-2, 23-3 and 23-4. On the other hand, the data signal, which is read out from the memory cell arrays 20-1 to 20-4 through the sense refresh amplifiers and input and output controllers 23-1 to 23-4, is inputted to the data-out buffer amplifier 6. The data-out buffer amplifier 6 converts the internal signal level of the data signal into the external signal level. Then, the data-out buffer amplifier 6 outputs the data signal having the external signal level through the data input and output terminal T3.

Moreover, the address signal is inputted to row decoders 21-1 to 21-4 and column decoders 22-1 to 22-4 through the address buffer amplifier 4. The row decoders 21-1 to 21-4 and the column decoders 22-1 to 22-4 decode the input address signal, respectively, and then, specify specific addresses on the memory cell arrays 20-1 to 20-4 by using the decoded addresses.

Furthermore, the external clock signal is inputted to the clock buffer amplifier 2 in a control clock signal generating circuit 1. The control clock signal generating circuit 1 comprises the clock buffer amplifier 2 and the clock generator 3. The clock buffer amplifier 2 converts the input external clock signal into a reference clock signal, and then, outputs the reference clock signal to the clock generator 3.

The clock generator 3 converts the input reference clock signal into various types of control clock signals. Then, the clock generator 3 uses the control clock signals to execute a predetermined control process of the row decoders 21-1 to 21-4, the column decoders 22-1 to 22-4, the sense refresh amplifiers and input and output controllers 23-1 to 23-4 and an internal test controller (not shown).

FIG. 18 is a block diagram of a detailed configuration of the control clock signal generating circuit 1 of FIG. 17.

Referring to FIG. 18, the external clock signals include an external $\overline{RAS}$ signal, an external $\overline{CAS}$ signal, an external $\overline{WE}$ signal and an external $\overline{OE}$ signal. In the specification and drawings, an upper line of each signal indicates a low enable signal for activating the operation at low level. The $\overline{RAS}$ signal is a row address control signal for controlling the latch of a row address, the amplification of data from the memory cell arrays, a refresh operation and an active or precharge operation of the overall DRAM chip. Moreover, the $\overline{CAS}$ signal is a column address control signal for controlling the latch of a column address, a read operation of data from the memory cell arrays or a write operation of data in the memory cell arrays. Furthermore, the $\overline{WE}$ signal is a write enable signal for controlling the read operation of data from the memory cell arrays or the write operation of data in the memory cell arrays. Furthermore, the $\overline{OE}$ signal is an output enable signal for controlling the read operation of data from the memory cell arrays.

The external $\overline{RAS}$ signal is inputted to an input buffer amplifier 7-1. The input buffer amplifier 7-1 converts the external $\overline{RAS}$ signal having the external signal level into an internal $\overline{RAS}$ signal having the internal signal level, and then, outputs the internal $\overline{RAS}$ signal to the clock buffer amplifier 2. Moreover, the external $\overline{CAS}$ signal is inputted to an input buffer amplifier 7-2. The input buffer amplifier 7-2 converts the external $\overline{CAS}$ signal having the external signal level into an internal $\overline{CAS}$ signal having the internal signal level, and then, outputs the internal $\overline{CAS}$ signal to the clock buffer amplifier 2. Furthermore, the external $\overline{WE}$ signal is inputted to an input buffer amplifier 7-3. The input buffer amplifier 7-3 converts the external $\overline{WE}$ signal having the external signal level into an internal $\overline{WE}$ signal having the internal signal level, and then, outputs the internal $\overline{WE}$ signal to the clock buffer amplifier 2. Furthermore, the external $\overline{OE}$ signal is inputted to an input buffer amplifier 7-4. The input buffer amplifier 7-4 converts the external $\overline{OE}$ signal having the external signal level into an internal $\overline{OE}$ signal having the internal signal level, and then, outputs the internal $\overline{OE}$ signal to the clock buffer amplifier 2. Therefore, internal clock signals include the internal $\overline{RAS}$ signal, the internal $\overline{CAS}$ signal, the internal $\overline{WE}$ signal and the internal $\overline{OE}$ signal.

The clock buffer amplifier 2 and the clock generator 3 constitute a control clock generator 30. The clock buffer amplifier 2 generates a predetermined plurality of reference clock signals in accordance with the internal $\overline{RAS}$ signal, the internal $\overline{CAS}$ signal, the internal $\overline{WE}$ signal and the internal $\overline{OE}$ signal, and then, outputs the reference clock signals to the clock generator 3. The clock generator 3 generates and outputs the control clock signal in accordance with the input reference clock signals. The control clock signals include the row address control signal, the column address control signal, a write and read control signal, a refresh mode control signal and a test mode control signal, as shown in FIG. 18.

FIG. 19 is a circuit diagram showing a configuration of a control clock generator 30a for a normal mode, which is an example of the control clock generator 30 of FIG. 18.

Referring to FIG. 19, the control clock generator 30a comprises two inverters INV1 and INV2, a NAND gate NAND1 and an AND gate AND1 with an inverted input terminal. The control clock generator 30a generates a $\overline{\text{RASE}}$ signal for controlling a row system control circuit 24 in accordance with the internal $\overline{\text{RAS}}$ signal and reference clock signals φ1 and φ2.

FIG. 20 is a circuit diagram showing a configuration of a control clock generator 30b for a special mode, namely, a $\overline{\text{CAS}}$ before $\overline{\text{RAS}}$ refresh mode (hereinafter referred to as a CbR mode), which is an example of the control clock generator 30 of FIG. 18. Referring to FIG. 20, the control clock generator 30b comprises two inverters INV3 and INV4 and two NAND gates NAND2 and NAND3. The control clock generator 30b generates a $\overline{\text{CbR}}$ signal for controlling a CbR refresh control circuit 25 in accordance with the internal $\overline{\text{CAS}}$ signal and the internal $\overline{\text{RAS}}$ signal.

FIG. 21 is a timing chart of the external $\overline{\text{RAS}}$ signal, the external $\overline{\text{CAS}}$ signal, the external $\overline{\text{WE}}$ signal and the external $\overline{\text{OE}}$ signal during the read operation in the normal mode of the related art. In the clock asynchronous DRAM 100 of the related art, the normal mode operation such as the read operation or the write operation is defined by a specification of a data book of the DRAM in accordance with the edges and levels of the external clock signals including the external $\overline{\text{RAS}}$ signal, the external $\overline{\text{CAS}}$ signal and the external $\overline{\text{WE}}$ signal, as shown in FIG. 21, for example.

FIG. 22 is a timing chart of the external $\overline{\text{RAS}}$ signal, the external $\overline{\text{CAS}}$ signal, the external $\overline{\text{WE}}$ signal and the external $\overline{\text{OE}}$ signal during a CbR refresh operation in the special mode of the related art. For example, as shown in FIG. 22, also in the case of the special mode such as the CbR mode or the like, the special mode operation is defined by the specification of the data book of the DRAM in accordance with the edges and levels of the external clock signals including the external $\overline{\text{RAS}}$ signal and the external $\overline{\text{CAS}}$ signal. In the CbR mode, the external $\overline{\text{CAS}}$ signal is made to be low enable before the external $\overline{\text{RAS}}$ signal is made to be low enable, this leads to that a condition for the special mode, namely, a condition for tCSR (in which the external $\overline{\text{RAS}}$ signal becomes low enable after the external $\overline{\text{CAS}}$ signal is set up) is satisfied.

As shown in FIG. 18, the external clock signals are inputted to the input buffer amplifiers 7-1 to 7-4 and are converted into the internal clock signals by the input buffer amplifiers 7-1 to 7-4. Then, the internal clock signals are converted into the control clock signals by the control clock generator 30. The control clock signals are simultaneously outputted to the control circuit for the normal mode and the control circuit for the special mode. When a noise is superimposed on the external clock signal in the normal mode operation, the normal mode may be thus switched to the special mode, and consequently an unexpected operation (malfunction) may occur.

FIG. 23 shows an example of occurrence of timing of the CbR mode due to a noise superimposed on the external $\overline{\text{RAS}}$ signal in the data read operation. When positive noise (noise having such a level as the level changing in a positive direction with respect to a signal level) is superimposed on the external $\overline{\text{RAS}}$ signal and the external $\overline{\text{CAS}}$ signal so as to satisfy the above-mentioned condition for tCSR in a period of time in which both of the external $\overline{\text{RAS}}$ signal and the external $\overline{\text{CAS}}$ signal have a low level, the condition for the CbR mode holds, and thus, the refresh operation starts. A problem is that memory cell data is destroyed due mainly to bit activation executed without following a regular procedure, but a cause of the problem somewhat varies according to the time of the condition for tCSR. Moreover, as this example of FIG. 23 shows, such an entry into the special mode as interrupting the normal mode operation (leading to abnormal stop) is more fatal than the case of noise superimposed on an access path. That is, because most of noise is likely to disappear on account of properties of the access path that the noise superimposed on the access path passes through many gates before an end circuit operates. On the other hand, the entry into the special mode is determined after passing through a few gates following the input terminal for the external clock signal, and therefore, the entry into the special mode is sensitive to the noise.

In the circuit configuration of the DRAM 100 of the related art, the normal mode and the special mode are distinguished from each other in accordance with only the edges and levels of the external clock signals. Thus, the noise superimposed on the external clock signal may confuse the distinction between the normal mode and the special mode.

SUMMARY OF THE INVENTION

An essential object of the present invention is to provide a semiconductor memory device capable of reducing or preventing any switching to the special mode from the normal mode operation due to noise on an external clock without affecting any influence on an access time of the semiconductor memory device.

According to the aspect of the present invention, there is provided a semiconductor memory device comprising:

input buffer amplifiers for converting a plurality of external clock signals into a plurality of internal clock signals each having an internal signal level, respectively;

a signal generating circuit for generating control clock signals for controlling an operation of the semiconductor memory device in accordance with the plurality of internal clock signals; and generating means having a time response characteristic gently changing according to a change in an input signal, the generating means generating an internal clock signal for a different special mode from a normal mode associated with either one of reading and writing of data from and in the semiconductor memory device in accordance with at least one of the plurality of external clock signals.

In the above-mentioned semiconductor memory device, the generating means is preferably provided in the input buffer amplifier.

In the above-mentioned semiconductor memory device, the generating means is preferably a noise filter provided so as to follow the input buffer amplifier, where the noise filter delays the change in the input signal and outputs a delayed signal as an output signal.

In the above-mentioned semiconductor memory device, the generating means are preferably provided for at least two of the plurality of external clock signals, and one of a plurality of generating means is provided in the input buffer amplifier, while another of the plurality of generating means is the noise filter provided so as to follow the input buffer amplifier.

In the above-mentioned semiconductor memory device, the plurality of external clock signals preferably include an external $\overline{\text{RAS}}$ signal and an external $\overline{\text{CAS}}$ signal, and the generating means are provided for the external $\overline{\text{RAS}}$ signal and the external $\overline{\text{CAS}}$ signal.

In the above-mentioned semiconductor memory device, the plurality of external clock signals preferably include an external $\overline{RAS}$ signal, an external $\overline{CAS}$ signal and an external $\overline{WE}$ signal, and the generating means are provided for the external $\overline{RAS}$ signal, the external $\overline{CAS}$ signal and the external $\overline{WE}$ signal.

In the above-mentioned semiconductor memory device, the plurality of external clock signals preferably include an external $\overline{RAS}$ signal, an external $\overline{CAS}$ signal, an external $\overline{WE}$ signal and an external $\overline{OE}$ signal, and the generating means are provided for the external $\overline{RAS}$ signal, the external $\overline{CAS}$ signal, the external $\overline{WE}$ signal and the external $\overline{OE}$ signal.

In the above-mentioned semiconductor memory device, each of the generating means provided for the external $\overline{RAS}$ signal and the external $\overline{CAS}$ signal is preferably provided in the input buffer amplifier.

In the above-mentioned semiconductor memory device, each of the generating means provided for the external $\overline{RAS}$ signal and the external $\overline{CAS}$ signal is preferably a noise filter provided so as to follow the input buffer amplifier, where the noise filter delays the change in the input signal and outputs a delayed signal as an output signal.

In the above-mentioned semiconductor memory device, the generating means provided for the external $\overline{RAS}$ signal is preferably provided in the input buffer amplifier, and the generating means provided for the external $\overline{CAS}$ signal is a noise filter provided so as to follow the input buffer amplifier, where the noise filter delays the change in the input signal and outputs a delayed signal as an output signal.

In the above-mentioned semiconductor memory device, the generating means provided for the external $\overline{RAS}$ signal is preferably a noise filter provided so as to follow the input buffer amplifier, where the noise filter delays the change in the input signal and outputs a delayed signal as an output signal. Further, the generating means provided for the external $\overline{CAS}$ signal is preferably provided in the input buffer amplifier.

In the above-mentioned semiconductor memory device, each of the generating means provided for the external $\overline{RAS}$ signal, the external $\overline{CAS}$ signal and the external $\overline{WE}$ signal is preferably provided in the input buffer amplifier.

In the above-mentioned semiconductor memory device, each of the generating means provided for the external $\overline{RAS}$ signal, the external $\overline{CAS}$ signal and the external $\overline{WE}$ signal is preferably a noise filter provided so as to follow the input buffer amplifier, where the noise filter delays the change in the input signal and outputs a delayed signal as an output signal.

In the above-mentioned semiconductor memory device, each of the generating means provided for the external $\overline{RAS}$ signal and the external $\overline{CAS}$ signal is preferably provided in the input buffer amplifier. Further, the generating means provided for the external $\overline{WE}$ signal is preferably a noise filter provided so as to follow the input buffer amplifier, where the noise filter delays the change in the input signal and outputs a delayed signal as an output signal.

In the above-mentioned semiconductor memory device, each of the generating means provided for the external $\overline{RAS}$ signal and the external $\overline{CAS}$ signal is preferably a noise filter provided so as to follow the input buffer amplifier, where the noise filter delays the change in the input signal and outputs a delayed signal as an output signal. Further, the generating means provided for the external $\overline{WE}$ signal is preferably provided in the input buffer amplifier.

In the above-mentioned semiconductor memory device, each of the generating means provided for the external $\overline{RAS}$ signal, the external $\overline{CAS}$ signal, the external $\overline{WE}$ signal and the external $\overline{OE}$ signal is preferably provided in the input buffer amplifier.

In the above-mentioned semiconductor memory device, each of the generating means provided for the external $\overline{RAS}$ signal, the external $\overline{CAS}$ signal, the external $\overline{WE}$ signal and the external $\overline{OE}$ signal is preferably a noise filter provided so as to follow the input buffer amplifier, where the noise filter delays the change in the input signal and outputs a delayed signal as an output signal.

In the above-mentioned semiconductor memory device, each of the generating means provided for the external $\overline{RAS}$ signal and the external $\overline{CAS}$ signal is preferably provided in the input buffer amplifier. Further, each of the generating means provided for the external $\overline{WE}$ signal and the external $\overline{OE}$ signal is preferably a noise filter provided so as to follow the input buffer amplifier, where the noise filter delays the change in the input signal and outputs a delayed signal as an output signal.

In the above-mentioned semiconductor memory device, each of the generating means provided for the external $\overline{RAS}$ signal and the external $\overline{CAS}$ signal is preferably a noise filter provided so as to follow the input buffer amplifier, where the noise filter delays the change in the input signal and outputs a delayed signal as an output signal. Further, each of the generating means provided for the external $\overline{WE}$ signal and the external $\overline{OE}$ signal is preferably provided in the input buffer amplifier.

Accordingly, the noise superimposed on the external clock signal can be delayed and reduced, and thus, the influence of the noise can be remarkably reduced. It is therefore possible to reduce, relax or prevent a malfunction due to the noise superimposed on the external clock signal, more particularly, such an entry into the special mode as interrupting the normal mode operation (leading to abnormal stop) such as the read or write operation or the like.

More particularly, the above-mentioned noise filter can eliminate both of the positive noise changing in the positive voltage direction and the negative noise changing in the negative voltage direction, which are superimposed on the external clock signal.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 1:
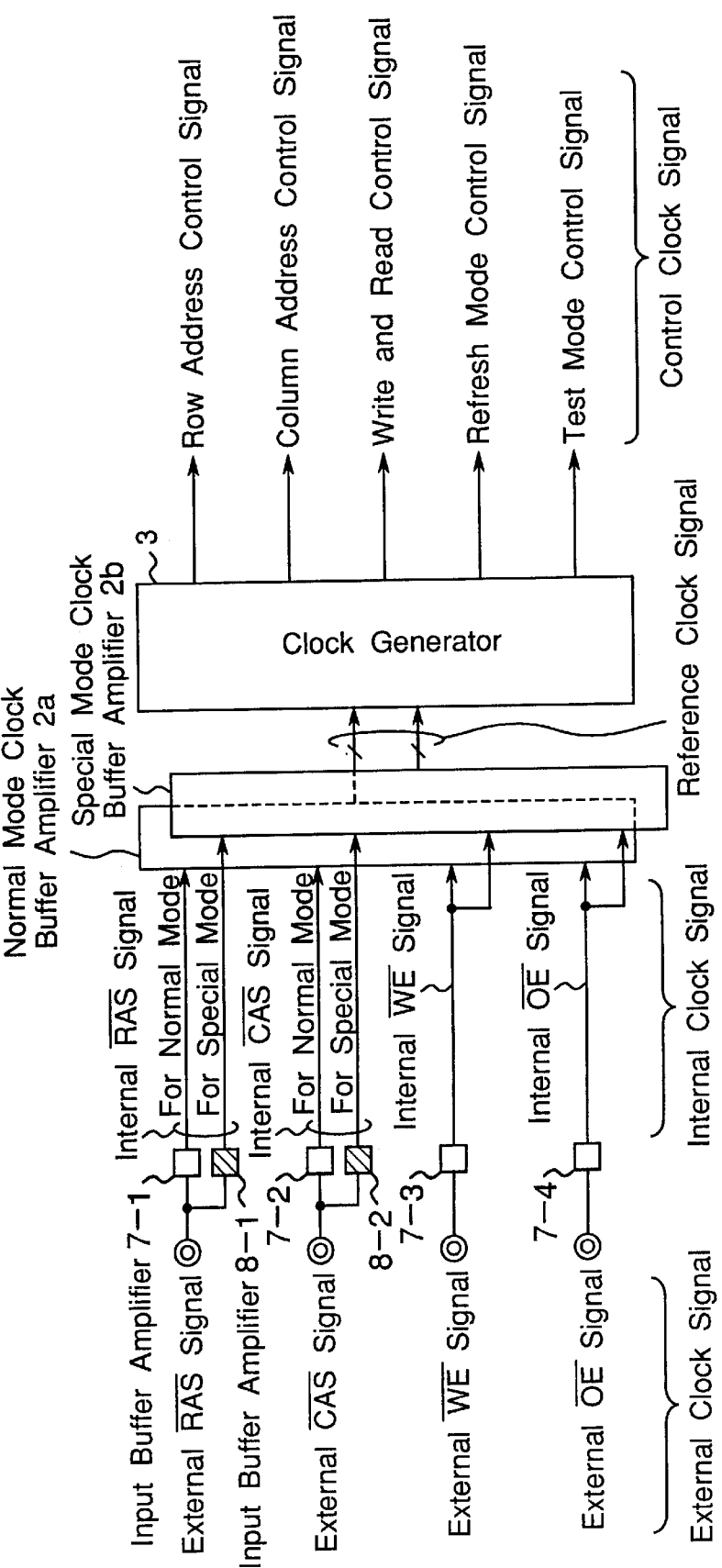
FIG. 1 is a block diagram showing a configuration of a control clock signal generating circuit 1a for a clock asynchronous DRAM of a first preferred embodiment according to the invention.

Preferred embodiments according to the invention will be described below with reference to the accompanying drawings. In the following drawings, the same components are indicated by the same reference numerals and symbols, respectively.

FIRST PREFERRED EMBODIMENT

FIG. 1 is a block diagram showing a configuration of a control clock signal generating circuit 1a for a clock asynchronous DRAM of a first preferred embodiment according to the invention. The control clock signal generating circuit 1a of the first preferred embodiment differs from the control clock signal generating circuit 1 of the related art shown in FIG. 18 in the following items (1) and (2).

(1) A clock buffer amplifier 2 is divided into a normal mode clock buffer amplifier 2a for generating a reference clock signal for a normal mode, and a special mode clock buffer amplifier 2b for generating a reference clock signal for a special mode.

Figure 18:
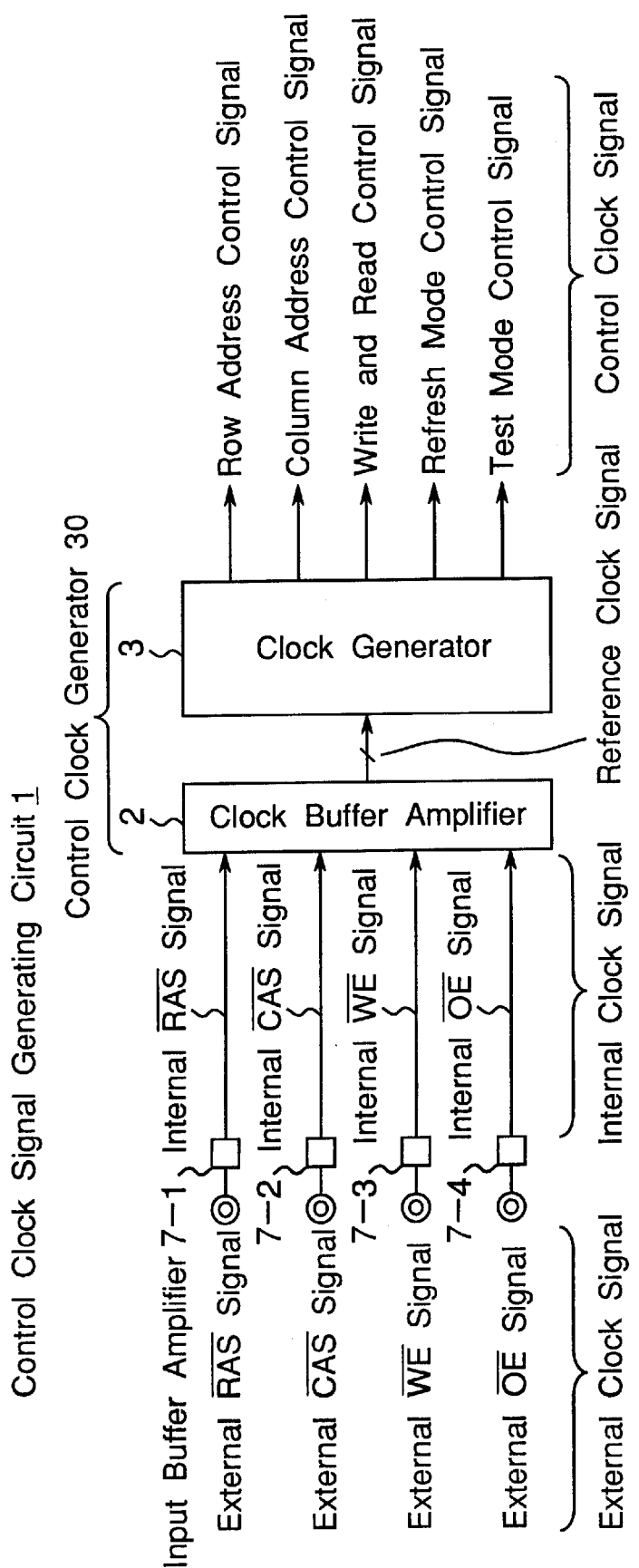
FIG. 18 is a block diagram showing a configuration of a control clock signal generating circuit 1 of FIG. 17.
Figure 19:
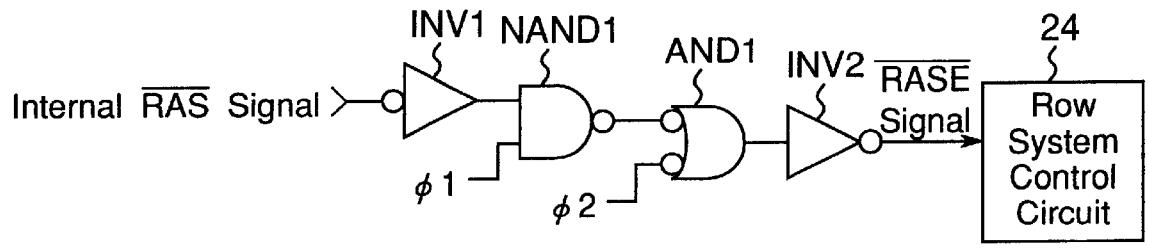
FIG. 19 is a circuit diagram showing a configuration of a control clock generator 30a for a normal mode, which is an example of a control clock generator 30 of FIG. 18.
Figure 20:
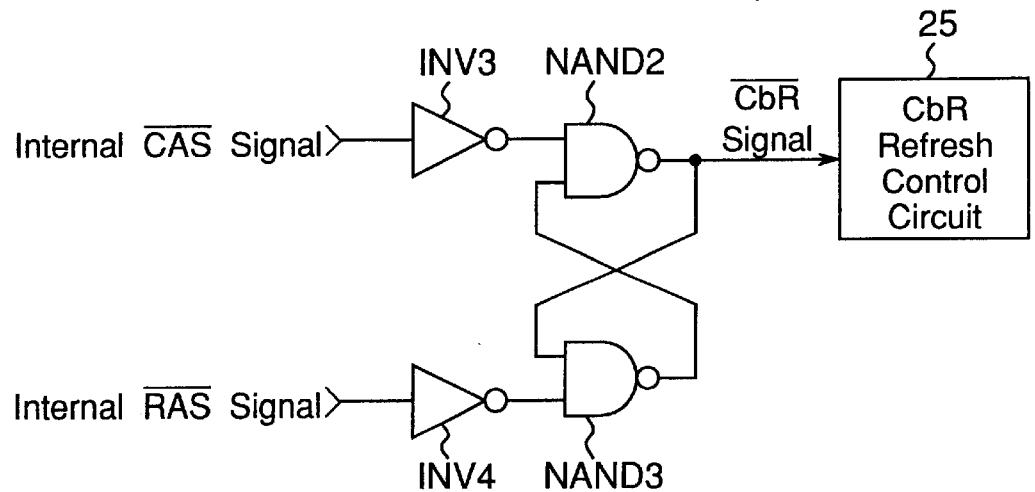
FIG. 20 is a circuit diagram showing a configuration of a control clock generator 30b for a special mode, which is an example of the control clock generator 30 of FIG. 18.
Figure 21:
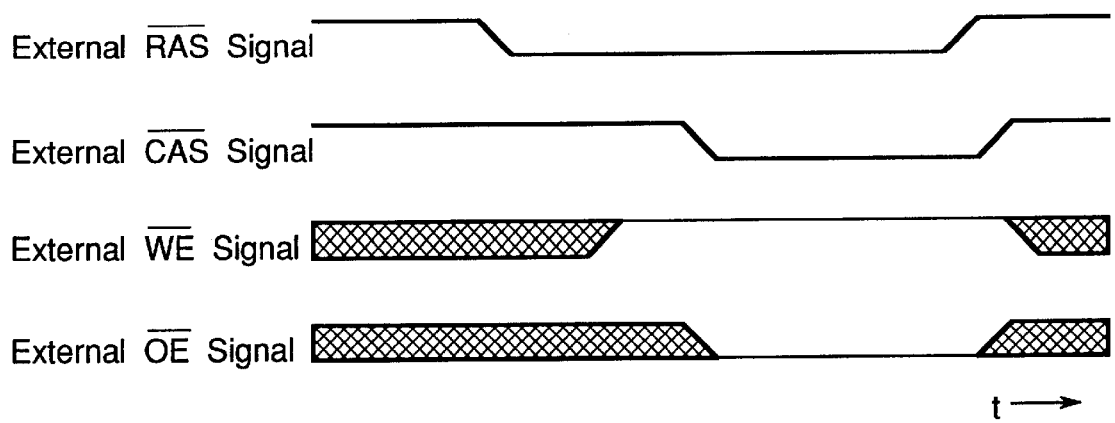
FIG. 21 is a timing chart of an external $\overline{RAS}$ signal, an external $\overline{CAS}$ signal, an external $\overline{WE}$ signal and an external $\overline{OE}$ signal during a read operation in the normal mode of the related art.
Figure 22:
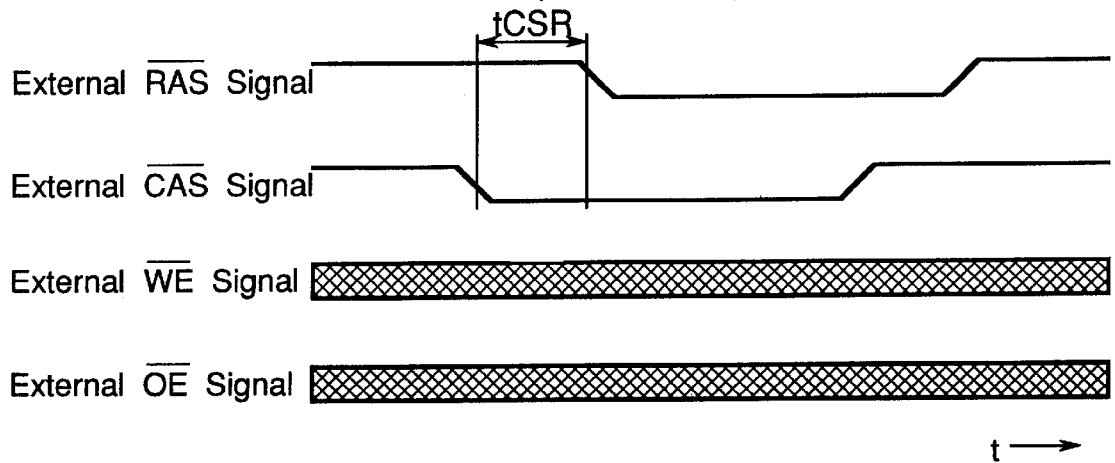
FIG. 22 is a timing chart of the external $\overline{RAS}$ signal, the external $\overline{CAS}$ signal, the external $\overline{WE}$ signal and the external $\overline{OE}$ signal during a CbR refresh operation in the special mode of the related art.
Figure 23:
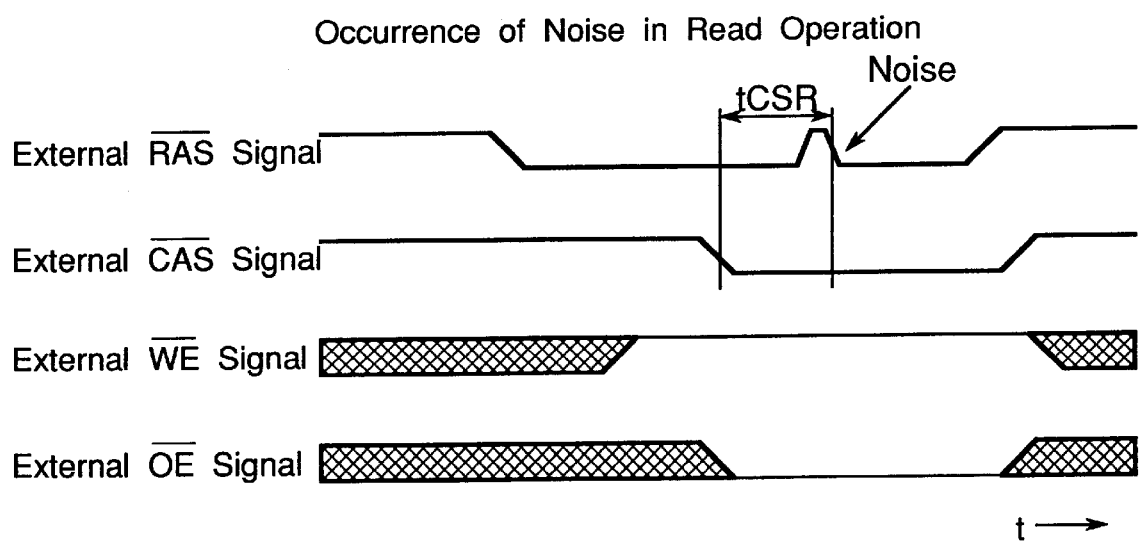
FIG. 23 is a timing chart of the external $\overline{RAS}$ signal, the external $\overline{CAS}$ signal, the external $\overline{WE}$ signal and the external $\overline{OE}$ signal, illustrating a problem caused upon occurrence of noise in the read operation in the normal mode of FIG. 21.

(2) As distinct from the same normal mode input buffer amplifiers 7-1 to 7-4 (hereinafter generically indicated by a numeral reference 7) as the input buffer amplifiers of FIG. 18, special mode input buffer amplifiers 8-1 and 8-2 are provided for an external $\overline{RAS}$ signal and an external $\overline{CAS}$ signal, respectively. The time response characteristic or sensitivity of the special mode input buffer amplifiers 8-1 and 8-2 to a rising edge or a trailing edge of an input external clock signal is lower than that of the normal mode input buffer amplifier 7.

It should be noted that the normal mode refers to a normal operation such as data read or write operation or the like. Moreover, the special mode refers to an operation mode other than the normal mode, for example, the operation mode such as a CbR mode, a $\overline{RAS}$ only refresh mode, a hidden refresh mode or an internal test mode. In this case, the $\overline{RAS}$ only refresh mode refers to the operation mode for refreshing the DRAM in accordance with only the external $\overline{RAS}$ signal. The $\overline{RAS}$ only refresh mode is characterized by the capability of refreshing without increasing any current consumption and without activating any external $\overline{CAS}$ signal. In the case where a refresh cycle follows a read cycle, when refresh is executed in the next cycle, the external $\overline{CAS}$ signal is once made to rise, and thus, the output terminal becomes a high impedance state. The mode for entering the next refresh cycle with the external $\overline{CAS}$ signal kept at low level in order to avoid the high impedance state is referred to as a hidden refresh mode hereinafter. Furthermore, the internal test mode refers to the operation mode for testing each circuit in the DRAM.

Referring to FIG. 1, the external $\overline{RAS}$ signal is inputted to the normal mode input buffer amplifier 7-1 and the special mode input buffer amplifier 8-1. The input buffer amplifier 7-1 converts the input external $\overline{RAS}$ signal having an external signal level into a normal mode internal $\overline{RAS}$ signal having an internal signal level, and then, outputs the normal mode internal $\overline{RAS}$ signal to the normal mode clock buffer amplifier 2a. Moreover, the input buffer amplifier 8-1 converts the input external $\overline{RAS}$ signal having the external signal level into a special mode internal $\overline{RAS}$ signal having the internal signal level, and then, outputs the special mode internal $\overline{RAS}$ signal to the special mode clock buffer amplifier 2b. The external $\overline{CAS}$ signal is inputted to the normal mode input buffer amplifier 7-2 and the special mode input buffer amplifier 8-2. The input buffer amplifier 7-2 converts the input external $\overline{CAS}$ signal having the external signal level into a normal mode internal $\overline{CAS}$ signal having the internal signal level, and then, outputs the normal mode internal $\overline{CAS}$ signal to the normal mode clock buffer amplifier 2a. Moreover, the input buffer amplifier 8-2 converts the input external $\overline{CAS}$ signal having the external signal level into a special mode internal $\overline{CAS}$ signal having the internal signal level, and then, outputs the special mode internal $\overline{CAS}$ signal to the special mode clock buffer amplifier 2b.

Furthermore, an external $\overline{WE}$ signal is inputted to the normal mode input buffer amplifier 7-3. The input buffer amplifier 7-3 converts the input external $\overline{WE}$ signal having the external signal level into a normal mode internal $\overline{WE}$ signal having the internal signal level, and then, outputs the normal mode internal $\overline{WE}$ signal to the normal mode clock buffer amplifier 2a and the special mode clock buffer amplifier 2b. Furthermore, an external $\overline{OE}$ signal is inputted to the normal mode input buffer amplifier 7-4. The input buffer amplifier 7-4 converts the input external $\overline{OE}$ signal having the external signal level into a normal mode internal $\overline{OE}$ signal having the internal signal level, and then, outputs the normal mode internal $\overline{OE}$ signal to the normal mode clock buffer amplifier 2a and the special mode clock buffer amplifier 2b.

Figure 17:
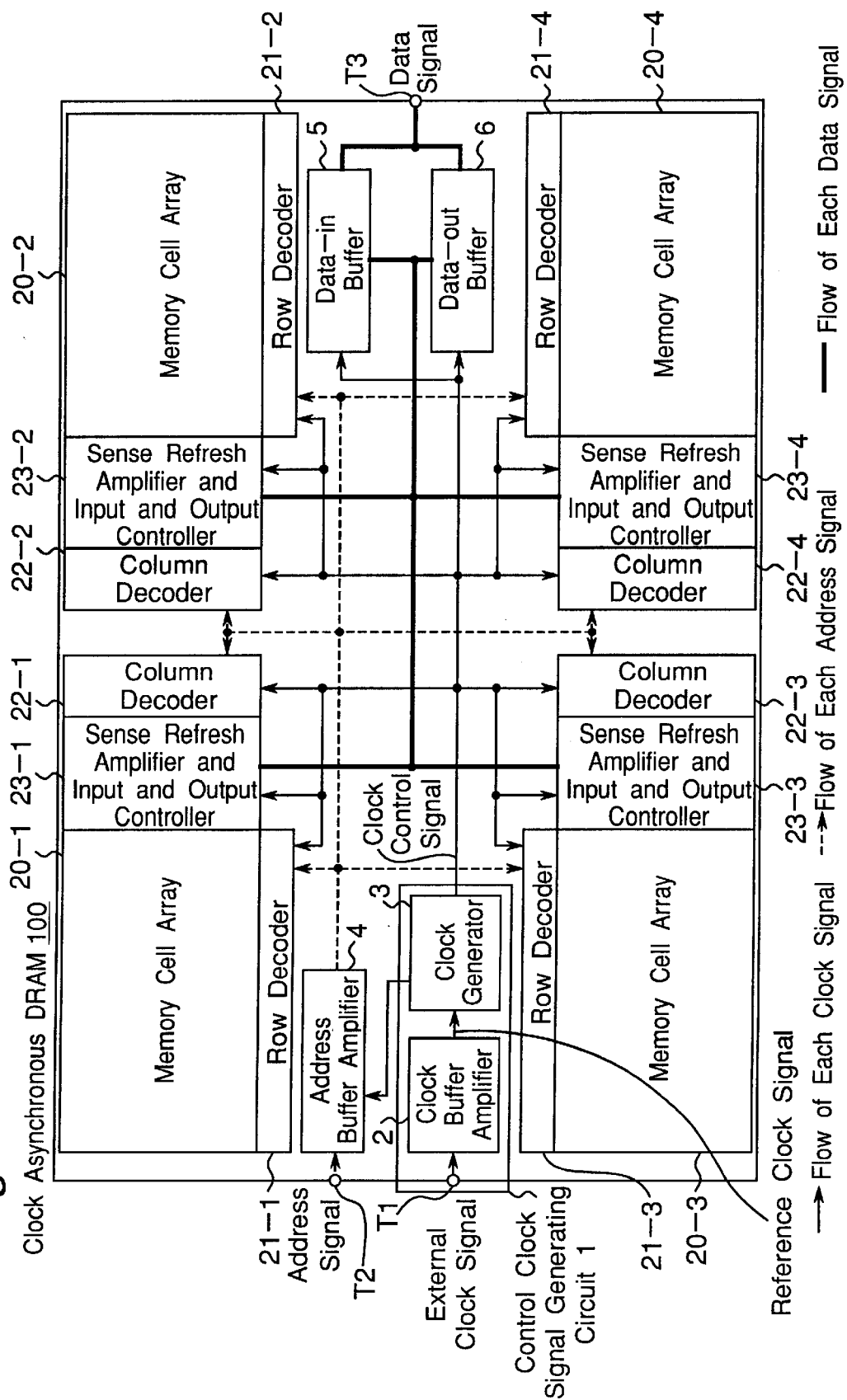
FIG. 17 is a block diagram showing a configuration of a clock asynchronous DRAM 100 of the related art.

The normal mode clock buffer amplifier 2a generates the normal mode reference clock signal in accordance with the input internal clock signal, and then, outputs the normal mode reference clock signal to a clock generator 3. Moreover, the special mode clock buffer amplifier 2b generates the special mode reference clock signal in accordance with the input internal clock signal, and then, outputs the special mode reference clock signal to the clock generator 3. Furthermore, the clock generator 3 converts the input reference clock signal into various types of control clock signals. Then, the clock generator 3 uses the control clock signals to execute a predetermined control process of row decoders 21-1 to 21-4, column decoders 22-1 to 22-4 and sense refresh amplifiers and input and output controllers 23-1 to 23-4 in the DRAM shown in FIG. 17 and an internal test controller (not shown). Various types of control clock signals include a row address control signal, a column address control signal, a write and read control signal, a refresh mode control signal and a test mode control signal, as shown in FIG. 1.

Figure 13:
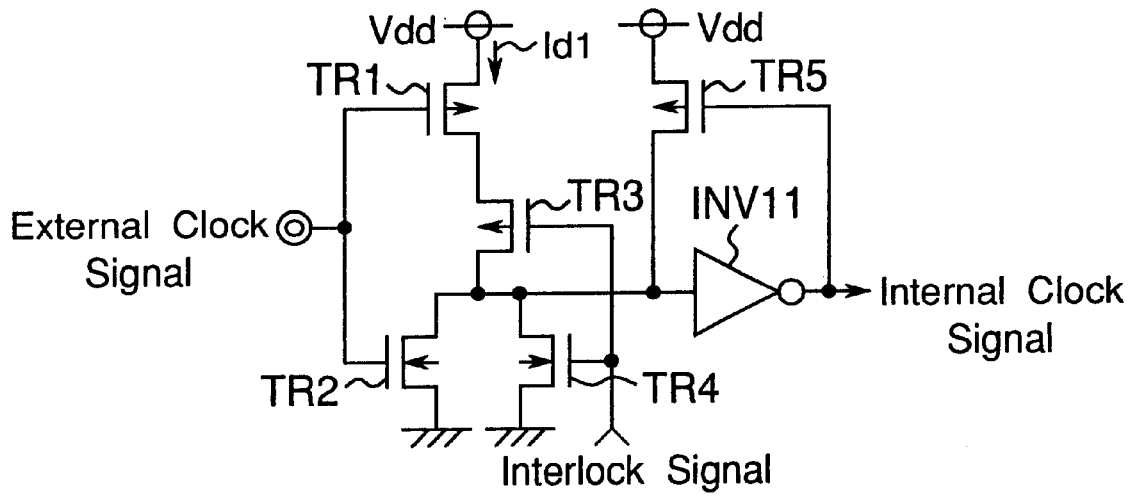
FIG. 13 is a circuit diagram showing a configuration of a normal mode input buffer amplifier 7 for use in the preferred embodiments.

FIG. 13 is a circuit diagram showing a configuration of the normal mode input buffer amplifier 7 for use in the preferred embodiments. As shown in FIG. 13, the normal mode input buffer amplifier 7 comprises five MOS field effect transistors (hereinafter referred to as an MOSFET) TR1 to TR5 and an inverter INV11.

Referring to FIG. 13, the external clock signal is inputted to the gate of the P-channel MOSFET TR1 and the gate of the source-grounded N-channel MOSFET TR2. An interlock signal is inputted to the gate of the P-channel MOSFET TR3 and the gate of the source-grounded N-channel MOSFET TR4. The interlock signal becomes high level when power is turned on, in order to reduce the current consumption while the DRAM is in a standby state. Moreover, a source of the MOSFET TR1 is connected to a direct-current voltage source Vdd, and a drain of the MOSFET TR1 is connected to the source of the MOSFET TR3. Furthermore, the drain of the MOSFET TR3 is connected to the drain of the MOSFET TR2, the source of the MOSFET TR4, the drain of the P-channel MOSFET TR5 and an input terminal of the inverter INV11. The source of the MOSFET TR5 is connected to the direct-current voltage source Vdd. Moreover, the internal clock signal outputted from the inverter INV11 is also inputted to the gate of the MOSFET TR5.

The normal mode input buffer amplifier 7 configured as described above corresponds to a well-known general NOR input buffer amplifier circuit. Since the external clock signal is specified so as to be in an active state at low level, it is general that the normal mode input buffer amplifier 7 has a NOR type first input stage. Moreover, the first input stage performs level conversion, whereas the following stage performs waveform shaping and increases a driving force. The level conversion by the first input stage will be described. For example, it is assumed that the high and low levels of the external clock signal are equal to 2.0 V and 0.8 V, respectively, and an operating power supply voltage of the DRAM is equal to 3.3 V. In this case, the respective logic threshold levels of the external and internal clock signals are equal to 1.4 V and 1.65 V, respectively, which differ from each other. The difference is optimized by matching a ratio of pull-up current to pull-down current of the first input stage, with the logic threshold level of the external clock signal. Thus, the high and low levels of the external clock signal are converted into the low and high levels of an internal operating power supply voltage, respectively. Even if the high and low levels of the external clock signal are established, the amplitude thereof is small. Thus, the transistor of the first input stage cannot be sufficiently cut off, and consequently, a through current always passes through the DRAM. Therefore, the interlock signal is inputted to the DRAM in order to save the current during the standby state of the DRAM.

Figure 14:
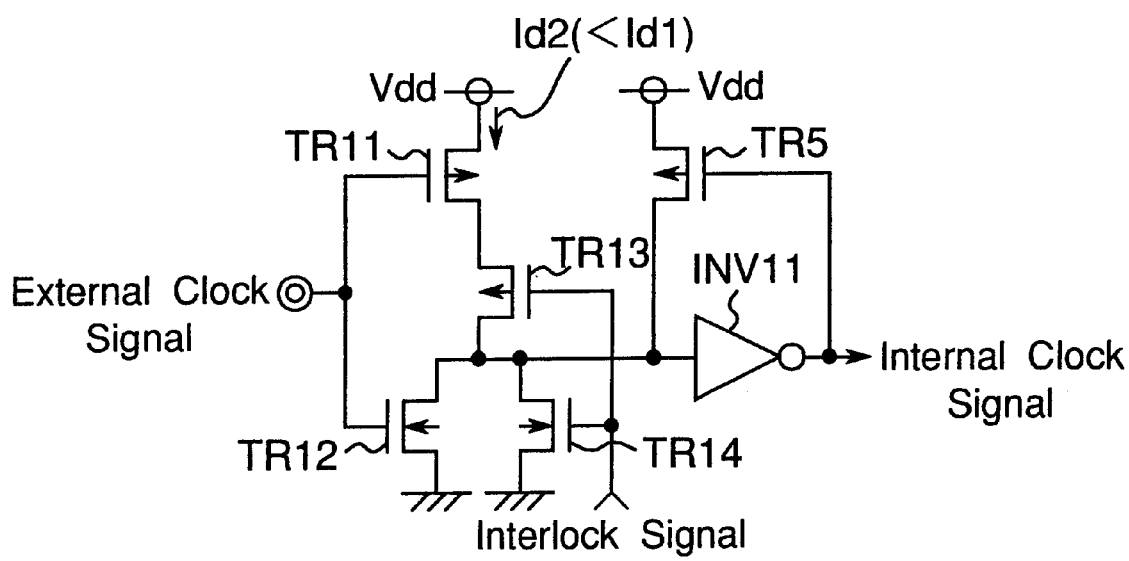
FIG. 14 is a circuit diagram showing a configuration of a special mode input buffer amplifier 8 for use in the preferred embodiments.

FIG. 14 is a circuit diagram showing a configuration of a special mode input buffer amplifier 8 for use in the preferred embodiments.

Referring to FIG. 14, the special mode input buffer amplifier 8 comprises five MOSFETs TR11 to TR14 and TR5 and the inverter INV11. The MOSFETs TR1 to TR4 of FIG. 13 correspond to the MOSFETs TR11 to TR14 of FIG. 14, respectively. The special mode input buffer amplifier 8 has the same circuit configuration as that of the normal mode input buffer amplifier 7 has. However, in the special mode input buffer amplifier 8, a gate length L of each of the MOSFETs TR11 to TR14 is longer than that of each of the MOSFETs TR1 to TR4 of FIG. 13. Thus, a drain current Id2 passing from the direct-current voltage source Vdd through the MOSFETs TR11 and TR13 to the MOSFETs TR12 and TR14 is smaller than a corresponding drain current Id1 of FIG. 13.

That is, the current of the first input stage is reduced, and thus, the time response characteristic with respect to level transition of the external clock signal is reduced, this leads to that the influence of noise superimposed on the external clock signal is reduced. As mentioned above, the gate length L of each of the MOSFETs TR11 to TR14 is increased so that the drain current Id2 is reduced to be less than the drain current Id1 of FIG. 13, this leads to that the time response characteristic or sensitivity can be reduced. In this case, the ratio of pull-up current to pull-down current of the first input stage is set so as not to change.

Figure 15:
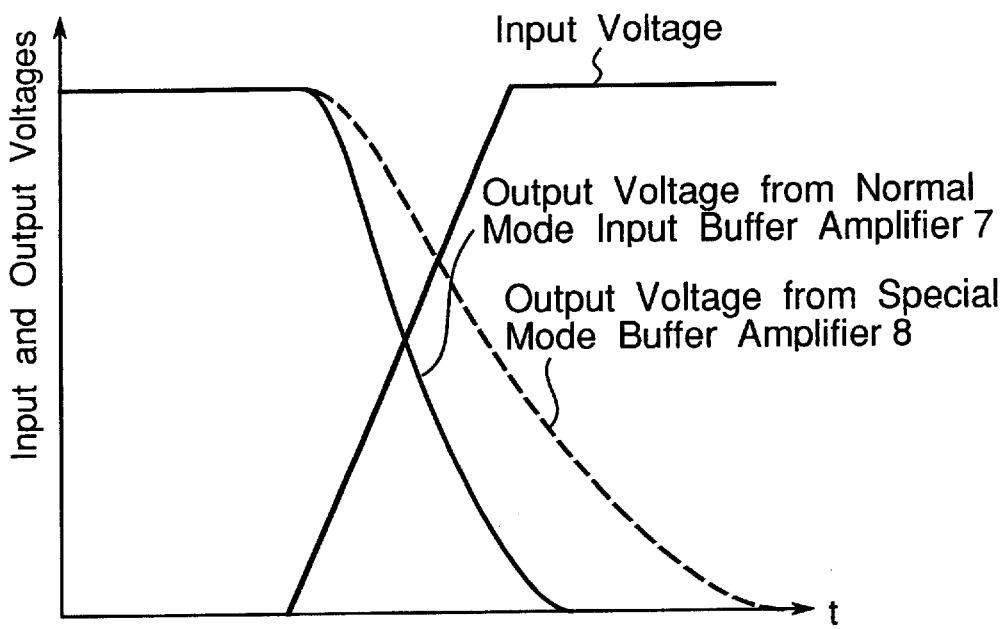
FIG. 15 is a graph of time response characteristic of output voltage to input voltage of the normal mode input buffer amplifier 7 of FIG. 13 and time response characteristic of output voltage to input voltage of the special mode input buffer amplifier 8 of FIG. 14.

FIG. 15 is a graph of time response characteristic of output voltage to input voltage of the normal mode input buffer amplifier 7 of FIG. 13 as well as time response characteristic of output voltage to input voltage of the special mode input buffer amplifier 8 of FIG. 14.

Referring to FIG. 15, the normal mode input buffer amplifier 7 trails in nearly real time on the rising edge of the input voltage, while the special mode input buffer amplifier 8 trails with delaying after the rising edge of the input voltage as compared with that of the normal mode input buffer amplifier 7. That is, the special mode input buffer amplifier 8 has such a time response characteristic of gently trailing. In other words, the special mode input buffer amplifier 8 has inferior time response characteristic or sensitivity. Moreover, in a manner similar to that of above, the trailing edge of the input voltage changes. Accordingly, the special mode input buffer amplifier 8 has the time response characteristic gently or slowly changing according to a change in the input signal, as compared with that of the normal mode input buffer amplifier 7. Thus, the noise superimposed on the external clock signal can be delayed and reduced, and therefore, the influence of the noise can be remarkably reduced.

As described above, according to the control clock signal generating circuit 1a according to the first preferred embodiment, the special mode input buffer amplifiers 8-1 and 8-2 are provided. Each of the special mode input buffer amplifiers 8-1 and 8-2 has the time response characteristic gently changing according to the change in the input signal as compared with those of the normal mode input buffer amplifiers 7-1 to 7-4, and generates the special mode internal $\overline{RAS}$ signal and the special mode internal $\overline{CAS}$ signal. Thus, the noise superimposed on the external clock signal such as the external $\overline{RAS}$ signal and the external $\overline{CAS}$ signal can be delayed and reduced, and thus, the influence of the noise can be remarkably reduced. It is therefore possible to reduce, relax or prevent a malfunction due to the noise superimposed on the external clock signal, more particularly, such an entry into the special mode as interrupting the normal mode operation (leading to abnormal stop) such as the read or write operation or the like.

SECOND PREFERRED EMBODIMENT

Figure 2:
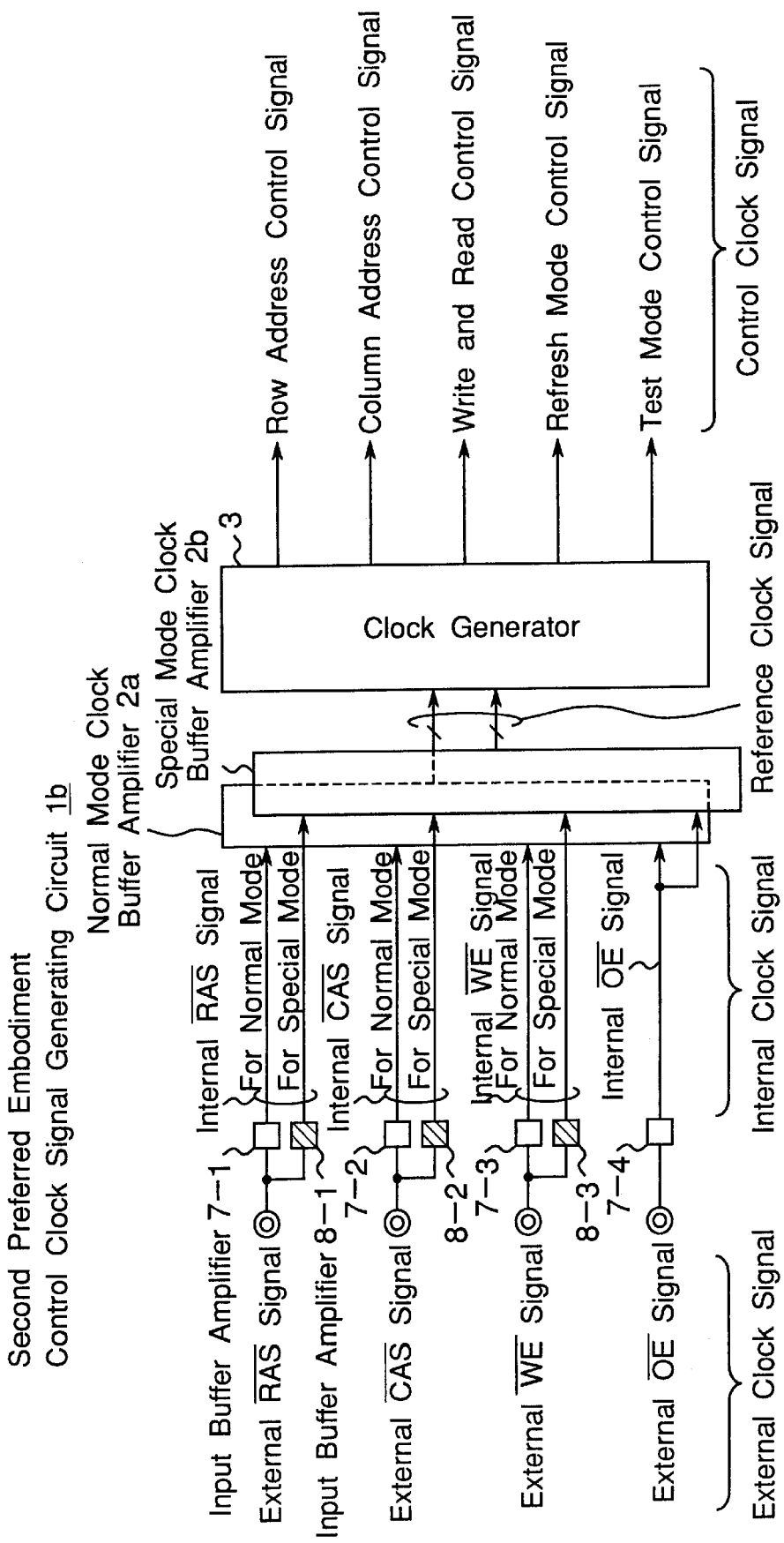
FIG. 2 is a block diagram showing a configuration of a control clock signal generating circuit 1b for a clock asynchronous DRAM of a second preferred embodiment according to the invention.

FIG. 2 is a block diagram showing a configuration of a control clock signal generating circuit 1b for a clock asynchronous DRAM of a second preferred embodiment according to the invention. The control clock signal generating circuit 1b of the second preferred embodiment is characterized by further comprising a special mode input buffer amplifier 8-3 as shown in FIG. 2, as compared with the control clock signal generating circuit 1a of FIG. 1. The special mode input buffer amplifier 8-3 has the time response characteristic gently changing according to the change in the input signal as compared with those of the normal mode input buffer amplifiers 7-1 to 7-4. The special mode input buffer amplifier 8-3 generates a special mode internal $\overline{WE}$ signal in response to the external $\overline{WE}$ signal, and outputs the special mode internal $\overline{WE}$ signal to the special mode clock buffer amplifier 2b. Therefore, the noise superimposed on the external clock signal such as the external $\overline{RAS}$ signal, the external $\overline{CAS}$ signal and the external $\overline{WE}$ signal can be delayed and reduced, and thus, the influence of the noise can be remarkably reduced. It is therefore possible to reduce, relax or prevent a malfunction due to the noise superimposed on the external clock signal, more particularly, such an entry into the special mode as interrupting the normal mode operation (leading to abnormal stop) such as the read or write operation or the like.

THIRD PREFERRED EMBODIMENT

Figure 3:
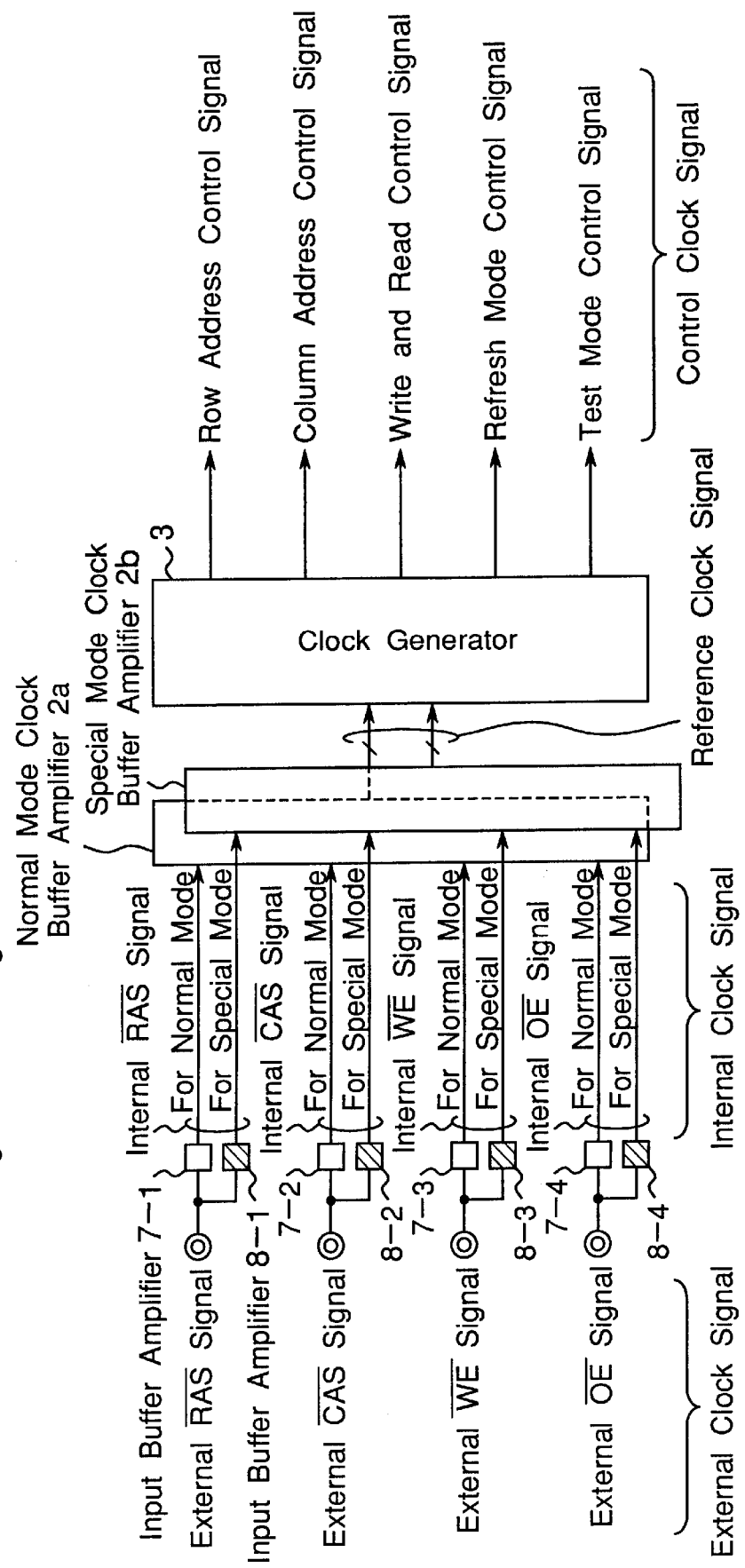
FIG. 3 is a block diagram showing a configuration of a control clock signal generating circuit 1c for a clock asynchronous DRAM of a third preferred embodiment according to the invention.

FIG. 3 is a block diagram showing a configuration of a control clock signal generating circuit 1c for a clock asynchronous DRAM of a third preferred embodiment according to the invention. The control clock signal generating circuit 1c of the third preferred embodiment is characterized by further comprising a special mode input buffer amplifier 8-4 as shown in FIG. 3, as compared with the control clock signal generating circuit 1b of FIG. 2. The special mode input buffer amplifier 8-4 has the time response characteristic gently changing according to the change in the input signal as compared with the normal mode input buffer amplifiers 7-1 to 7-4. The special mode input buffer amplifier 8-4 generates a special mode internal $\overline{OE}$ signal in response to the external $\overline{OE}$ signal, and outputs the special mode internal $\overline{OE}$ signal to the special mode clock buffer amplifier 2b.

Accordingly, the noise superimposed on the external clock signal such as the external $\overline{RAS}$ signal, the external $\overline{CAS}$ signal, the external $\overline{WE}$ signal and the external $\overline{OE}$ signal can be delayed and reduced, and thus, the influence of the noise can be remarkably reduced. It is therefore possible to reduce, relax or prevent a malfunction due to the noise superimposed on the external clock signal, more particularly, such an entry into the special mode as interrupting the normal mode operation (leading to abnormal stop) such as the read or write operation or the like.

FOURTH PREFERRED EMBODIMENT

Figure 4:
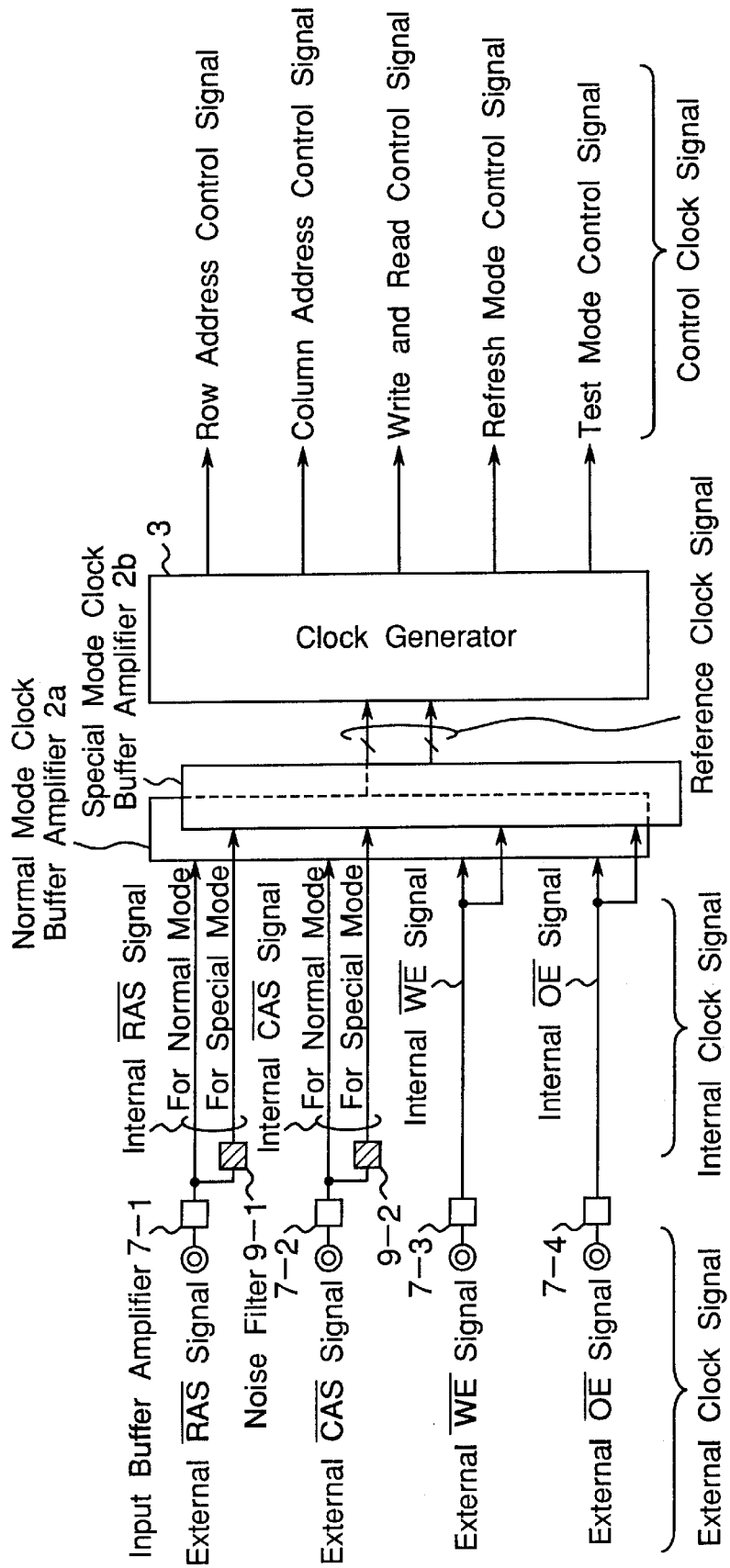
FIG. 4 is a block diagram showing a configuration of a control clock signal generating circuit 1d for a clock asynchronous DRAM of a fourth preferred embodiment according to the invention.

FIG. 4 is a block diagram showing a configuration of a control clock signal generating circuit 1d for a clock asynchronous DRAM of a fourth preferred embodiment according to the invention. The control clock signal generating circuit 1d of the fourth preferred embodiment differs from the control clock signal generating circuit 1 of the related art shown in FIG. 18 in the following items (1) and (2).

(1) In a manner similar to that of the first preferred embodiment, the clock buffer amplifier 2 is divided into the normal mode clock buffer amplifier 2a for generating the reference clock signal for the normal mode and the special mode clock buffer amplifier 2b for generating the reference clock signal for the special mode.

(2) Noise filters 9-1 and 9-2 each for eliminating the noise superimposed on the input external clock signal, where each of the noise filters 9-1 and 9-2 is provided so as to follow the input buffer amplifiers 7-1 and 7-2, respectively. The noise filters 9-1 and 9-2 are provided for the internal $\overline{RAS}$ signal and the internal $\overline{CAS}$ signal, respectively.

The difference between the fourth preferred embodiment and the related art or the first preferred embodiment will be described below.

Referring to FIG. 4, the input buffer amplifier 7-1 converts the input external $\overline{RAS}$ signal having the external signal level into the normal mode internal $\overline{RAS}$ signal having the internal signal level, and then, outputs the normal mode internal $\overline{RAS}$ signal to the normal mode clock buffer amplifier 2a and the noise filter 9-1. The noise filter 9-1 eliminates the noise superimposed on the input normal mode internal $\overline{RAS}$ signal. Then, the noise filter 9-1 outputs the noise-eliminated signal as the special mode internal $\overline{RAS}$ signal to the special mode clock buffer amplifier 2b. Moreover, the input buffer amplifier 7-2 converts the input external $\overline{CAS}$ signal having the external signal level into the normal mode internal $\overline{CAS}$ signal having the internal signal level, and then, outputs the normal mode internal $\overline{CAS}$ signal to the normal mode clock buffer amplifier 2a and the noise filter 9-2. The noise filter 9-2 eliminates the noise superimposed on the input normal mode internal $\overline{CAS}$ signal. Then, the noise filter 9-2 outputs the noise-eliminated signal as the special mode internal $\overline{CAS}$ signal to the special mode clock buffer amplifier 2b.

Figure 16:
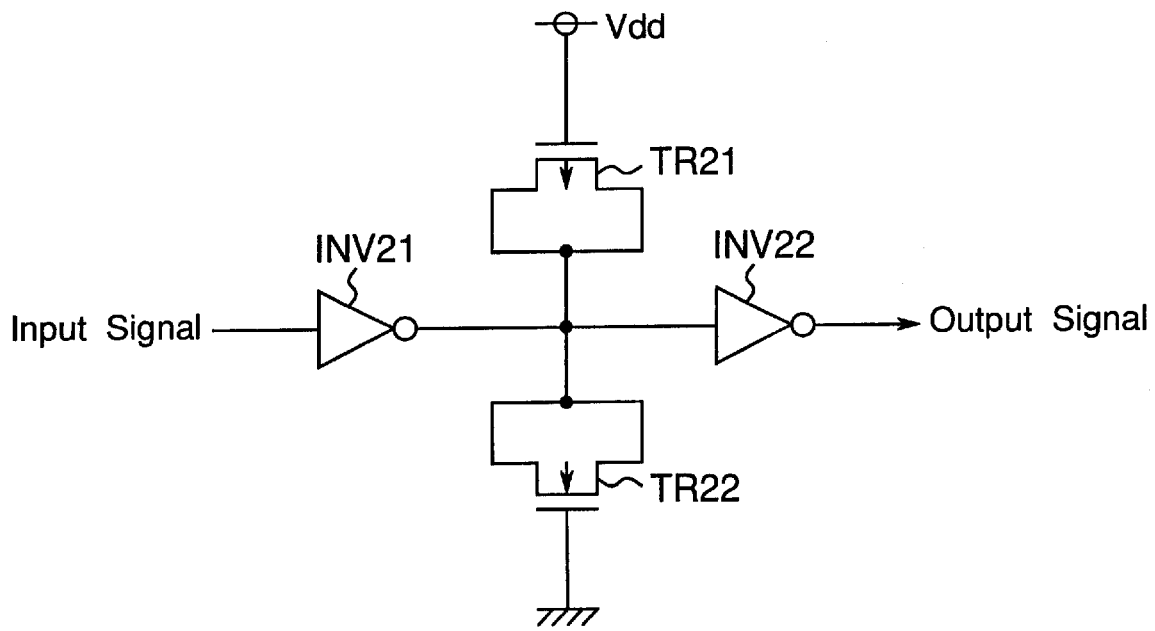
FIG. 16 is a circuit diagram showing a configuration of a noise filter 9 for use in the preferred embodiments.

FIG. 16 is a circuit diagram showing a configuration of a noise filter 9 for use in the preferred embodiments. The noise filter 9 comprises two inverters INV21 and INV22, a P-channel MOSFET TR21, and a gate-grounded N-channel MOSFET TR22.

Referring to FIG. 16, the input signal is outputted as an output signal through the two inverters INV21 and INV22.

A point of connection between the two inverters INV21 and INTV22 is connected to the source and drain of the MOSFET TR21, and is connected to the source and drain of the MOSFET TR22. Moreover, the gate of the MOSFET TR21 is connected to the direct-current voltage source Vdd. Each of the MOSFETs TR21 and TR22 constitutes the so-called MOS capacitor, and gently changes the time response characteristic of the signal which passes through the point of connection between the two inverters INV21 and INV22. Therefore, the noise filter 9 has such a time response characteristic that gently rises with delaying after the rising edge of the input signal and gently trails with delaying after the trailing edge thereof. That is, the noise filter 9 has the time response characteristic gently changing according to the change in the input signal. Accordingly, the noise filter 9 can eliminate both of a positive noise changing in a positive voltage direction and a negative noise changing in a negative voltage direction, which are superimposed on the external clock signal.

As described above, according to the control clock signal generating circuit 1d according to the fourth preferred embodiment, the noise filters 9-1 and 9-2 are provided. The noise filters 9-1 and 9-2 have the time response characteristic gently changing according to the change in the input signal. The noise filters 9-1 and 9-2 generate the special mode internal $\overline{RAS}$ signal and the special mode internal $\overline{CAS}$ signal in response to the normal mode internal $\overline{RAS}$ signal and the normal mode internal $\overline{CAS}$ signal, respectively. Thus, the noise superimposed on the external clock signal such as the external $\overline{RAS}$ signal and the external $\overline{CAS}$ signal can be delayed and reduced, and thus, the influence of the noise can be remarkably reduced. It is therefore possible to reduce, relax or prevent a malfunction due to the noise superimposed on the external clock signal, more particularly, such an entry into the special mode as interrupting the normal mode operation (leading to abnormal stop) such as the read or write operation or the like.

FIFTH PREFERRED EMBODIMENT

Figure 5:
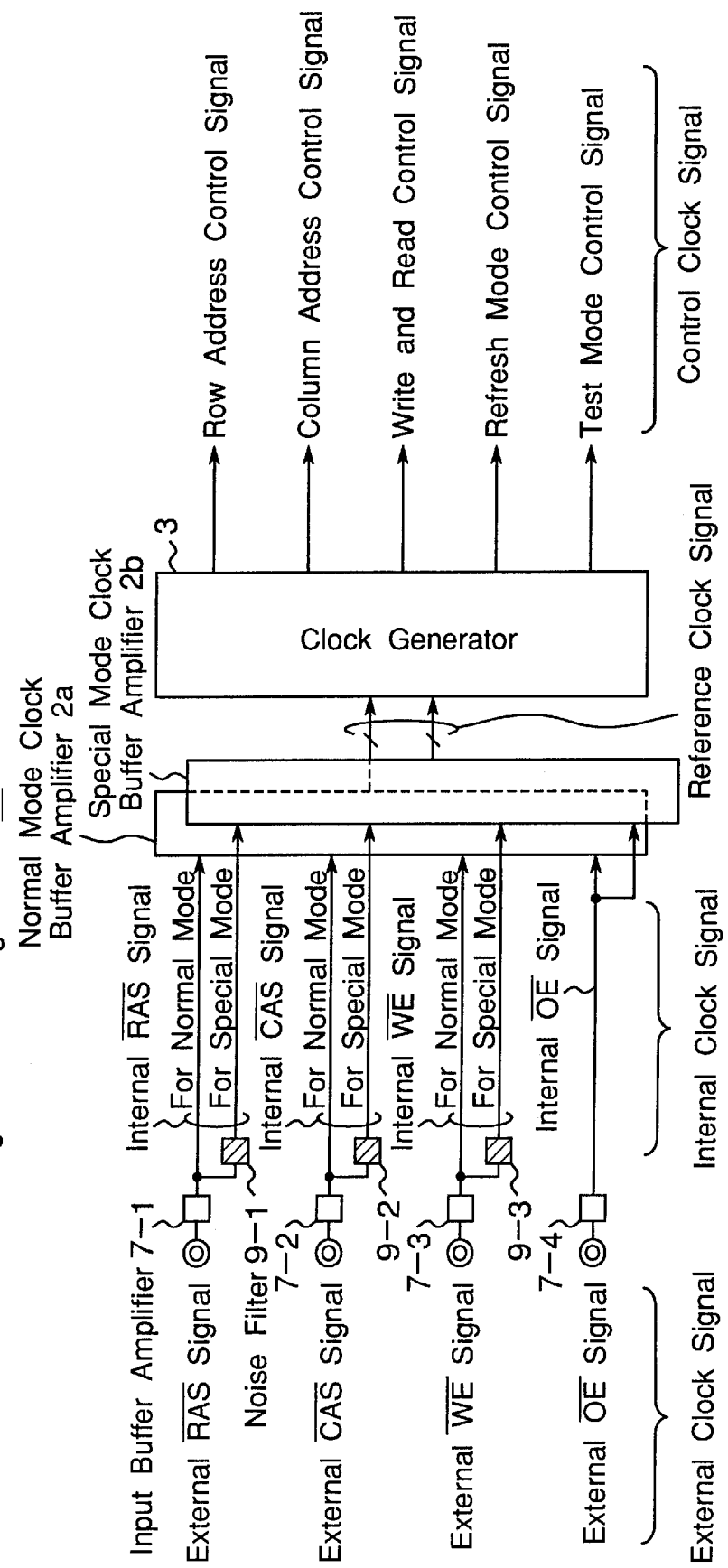
FIG. 5 is a block diagram showing a configuration of a control clock signal generating circuit 1e for a clock asynchronous DRAM of a fifth preferred embodiment according to the invention.

FIG. 5 is a block diagram showing a configuration of a control clock signal generating circuit 1e for a clock asynchronous DRAM of a fifth preferred embodiment according to the invention. The control clock signal generating circuit 1e of the fifth preferred embodiment is characterized by further comprising a noise filter 9-3 as shown in FIG. 5, as compared with the control clock signal generating circuit 1d of FIG. 4. The noise filter 9-3 has the time response characteristic gently changing according to the change in the input signal. The noise filter 9-3 generates the special mode internal $\overline{WE}$ signal in response to the normal mode internal $\overline{WE}$ signal outputted from the input buffer amplifier 7-3.

Accordingly, the noise superimposed on the external clock signal such as the external $\overline{RAS}$ signal, the external $\overline{CAS}$ signal and the external $\overline{WE}$ signal can be delayed and reduced, and thus, the influence of the noise can be remarkably reduced. It is therefore possible to reduce, relax or prevent a malfunction due to the noise superimposed on the external clock signal, more particularly, such an entry into the special mode as interrupting the normal mode operation (leading to abnormal stop) such as the read or write operation or the like.

SIXTH PREFERRED EMBODIMENT

Figure 6:
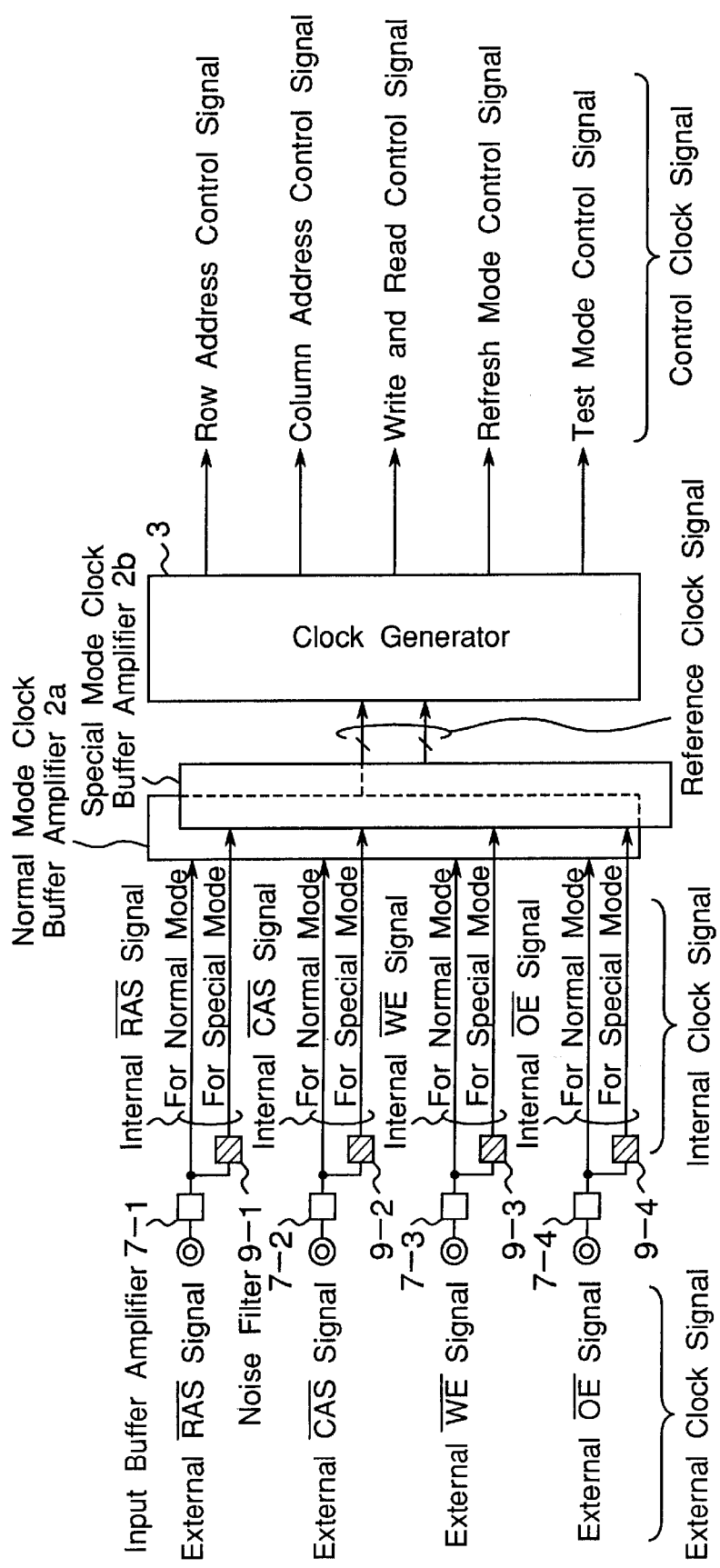
FIG. 6 is a block diagram showing a configuration of a control clock signal generating circuit 1f for a clock asynchronous DRAM of a sixth preferred embodiment according to the invention.

FIG. 6 is a block diagram showing a configuration of a control clock signal generating circuit 1f for a clock asynchronous DRAM of a sixth preferred embodiment according to the invention. The control clock signal generating circuit 1f of the sixth preferred embodiment is characterized by further comprising a noise filter 9-4 as shown in FIG. 6, as compared with the control clock signal generating circuit 1e of FIG. 5. The noise filter 9-4 has the time response characteristic gently changing according to the change in the input signal. The noise filter 9-4 generates the special mode internal $\overline{OE}$ signal in response to the normal mode internal $\overline{OE}$ signal outputted from the input buffer amplifier 7-4.

Accordingly, the noise superimposed on the external clock signal such as the external $\overline{RAS}$ signal, the external $\overline{CAS}$ signal, the external $\overline{WE}$ signal and the external $\overline{OE}$ signal can be delayed and reduced, and thus, the influence of the noise can be remarkably reduced. It is therefore possible to reduce, relax or prevent a malfunction due to the noise superimposed on the external clock signal, more particularly, such an entry into the special mode as interrupting the normal mode operation (leading to abnormal stop) such as the read or write operation or the like.

SEVENTH PREFERRED EMBODIMENT

Figure 7:
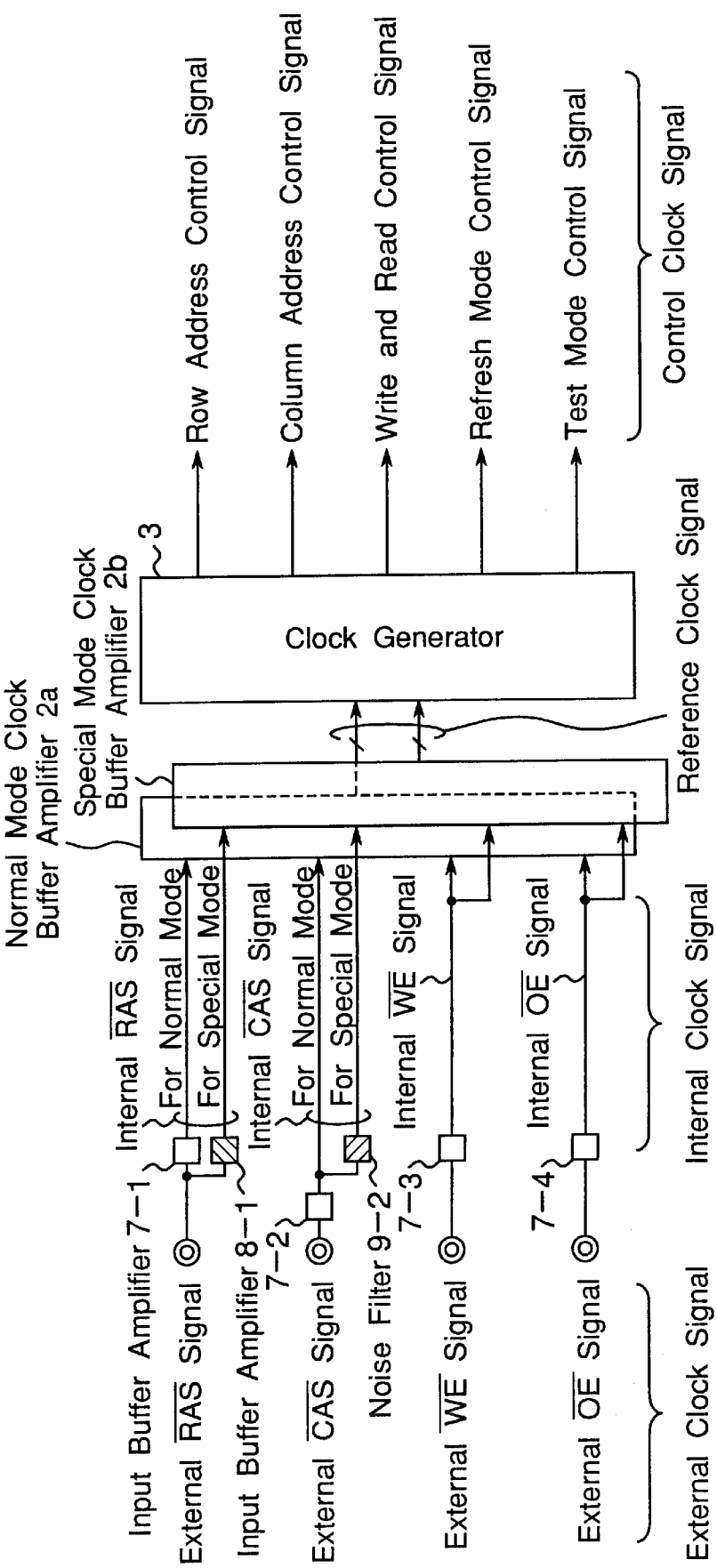
FIG. 7 is a block diagram showing a configuration of a control clock signal generating circuit 1g for a clock asynchronous DRAM of a seventh preferred embodiment according to the invention.

FIG. 7 is a block diagram showing a configuration of a control clock signal generating circuit 1g for a clock asynchronous DRAM of a seventh preferred embodiment according to the invention.

Referring to FIG. 7, the control clock signal generating circuit 1g of the seventh preferred embodiment is characterized by that the input buffer amplifiers 7-1 and 8-1 according to the first preferred embodiment of FIG. 1 are provided for the external $\overline{RAS}$ signal, while the input buffer amplifier 7-2 and the noise filter 9-2 according to the fourth preferred embodiment of FIG. 4 are provided for the external $\overline{CAS}$ signal.

Accordingly, the noise superimposed on the external clock signal such as the external $\overline{RAS}$ signal and the external $\overline{CAS}$ signal can be delayed and reduced, and thus, the influence of the noise can be remarkably reduced. It is therefore possible to reduce, relax or prevent a malfunction due to the noise superimposed on the external clock signal, more particularly, such an entry into the special mode as interrupting the normal mode operation (leading to abnormal stop) such as the read or write operation or the like.

EIGHTH PREFERRED EMBODIMENT

Figure 8:
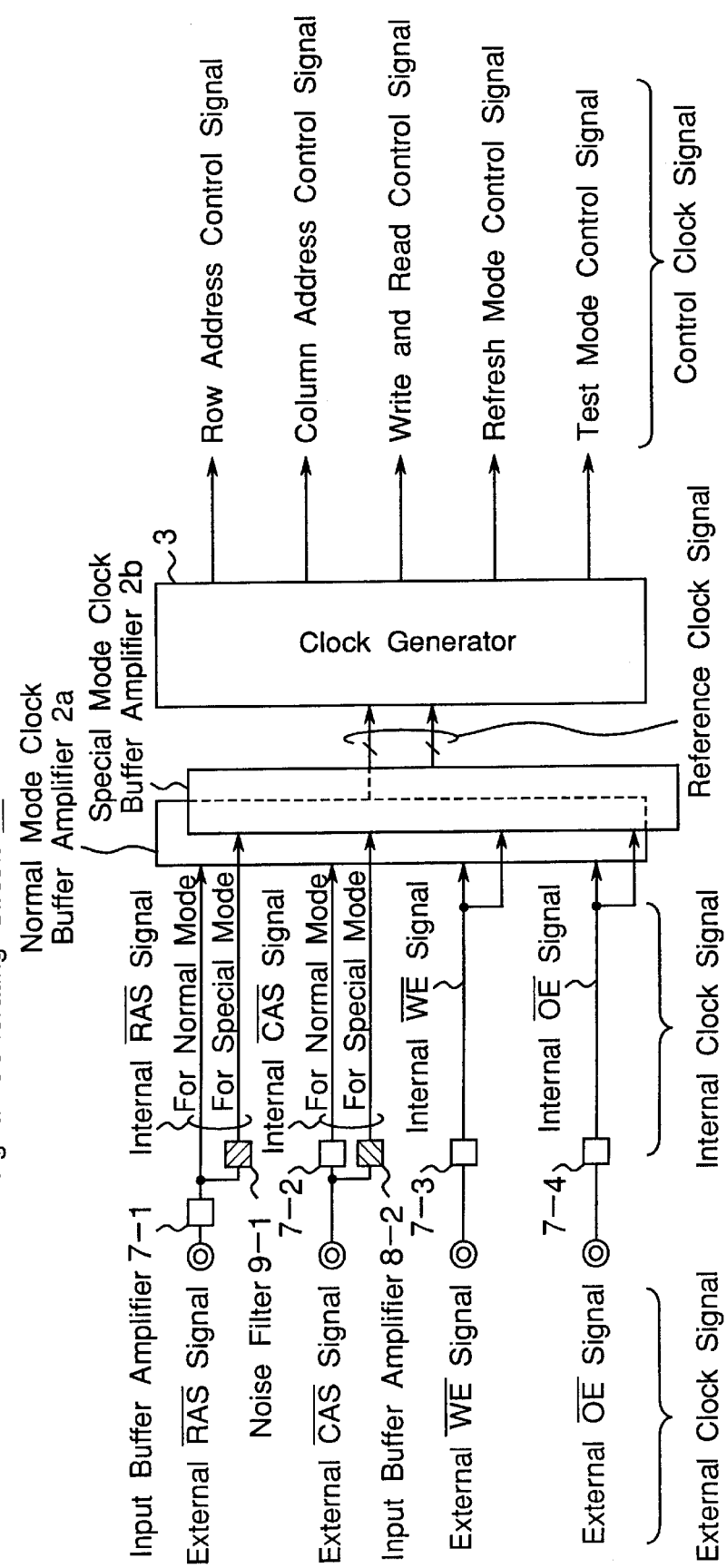
FIG. 8 is a block diagram showing a configuration of a control clock signal generating circuit 1h for a clock asynchronous DRAM of an eighth preferred embodiment according to the invention.

FIG. 8 is a block diagram showing a configuration of a control clock signal generating circuit 1h for a clock asynchronous DRAM of an eighth preferred embodiment according to the invention.

Referring to FIG. 8, the control clock signal generating circuit 1h of the eighth preferred embodiment is characterized by that the input buffer amplifier 7-1 and the noise filter 9-1 according to the fourth preferred embodiment of FIG. 4 are provided for the external $\overline{RAS}$ signal, while the input buffer amplifiers 7-2 and 8-2 according to the first preferred embodiment of FIG. 1 are provided for the external $\overline{CAS}$ signal.

Accordingly, the noise superimposed on the external clock signal such as the external $\overline{RAS}$ signal and the external $\overline{CAS}$ signal can be delayed and reduced, and thus, the influence of the noise can be remarkably reduced. It is therefore possible to reduce, relax or prevent a malfunction due to the noise superimposed on the external clock signal, more particularly, such an entry into the special mode as interrupting the normal mode operation (leading to abnormal stop) such as the read or write operation or the like.

NINTH PREFERRED EMBODIMENT

Figure 9:
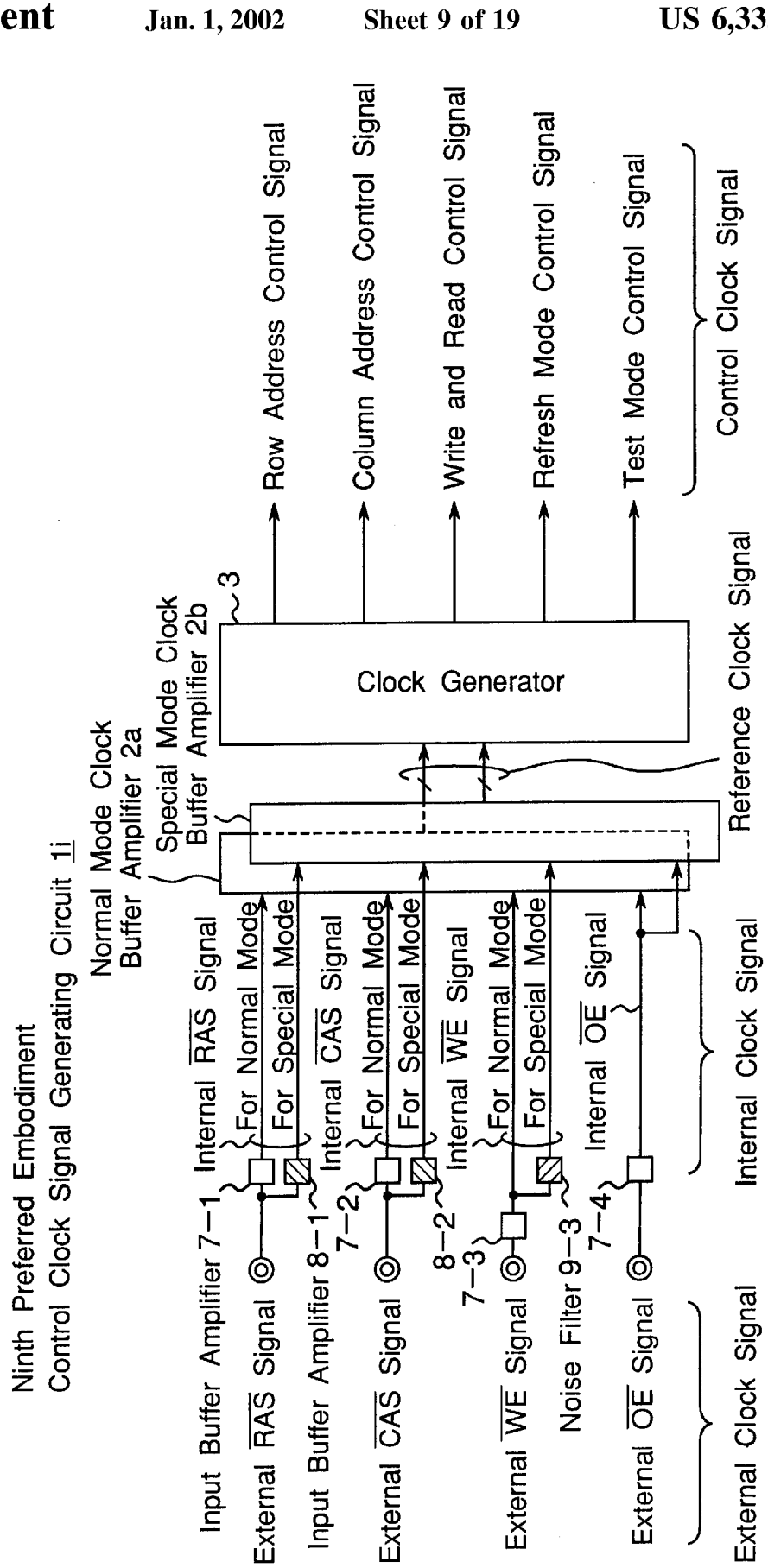
FIG. 9 is a block diagram showing a configuration of a control clock signal generating circuit 1i for a clock asynchronous DRAM of a ninth preferred embodiment according to the invention.

FIG. 9 is a block diagram showing a configuration of a control clock signal generating circuit 1i for a clock asynchronous DRAM of a ninth preferred embodiment according to the invention.

Referring to FIG. 9, the control clock signal generating circuit 1i of the ninth preferred embodiment is characterized by that the noise filter 9-3 according to the fourth preferred embodiment of FIG. 4 is further provided for the external $\overline{WE}$ signal, in addition to the configuration of the control clock signal generating circuit 1a according to the first preferred embodiment of FIG. 1.

Accordingly, the noise superimposed on the external clock signal such as the external $\overline{RAS}$ signal, the external $\overline{CAS}$ signal and the external $\overline{WE}$ signal can be delayed and reduced, and thus, the influence of the noise can be remarkably reduced. It is therefore possible to reduce, relax or prevent a malfunction due to the noise superimposed on the external clock signal, more particularly, such an entry into the special mode as interrupting the normal mode operation (leading to abnormal stop) such as the read or write operation or the like.

TENTH PREFERRED EMBODIMENT

Figure 10:
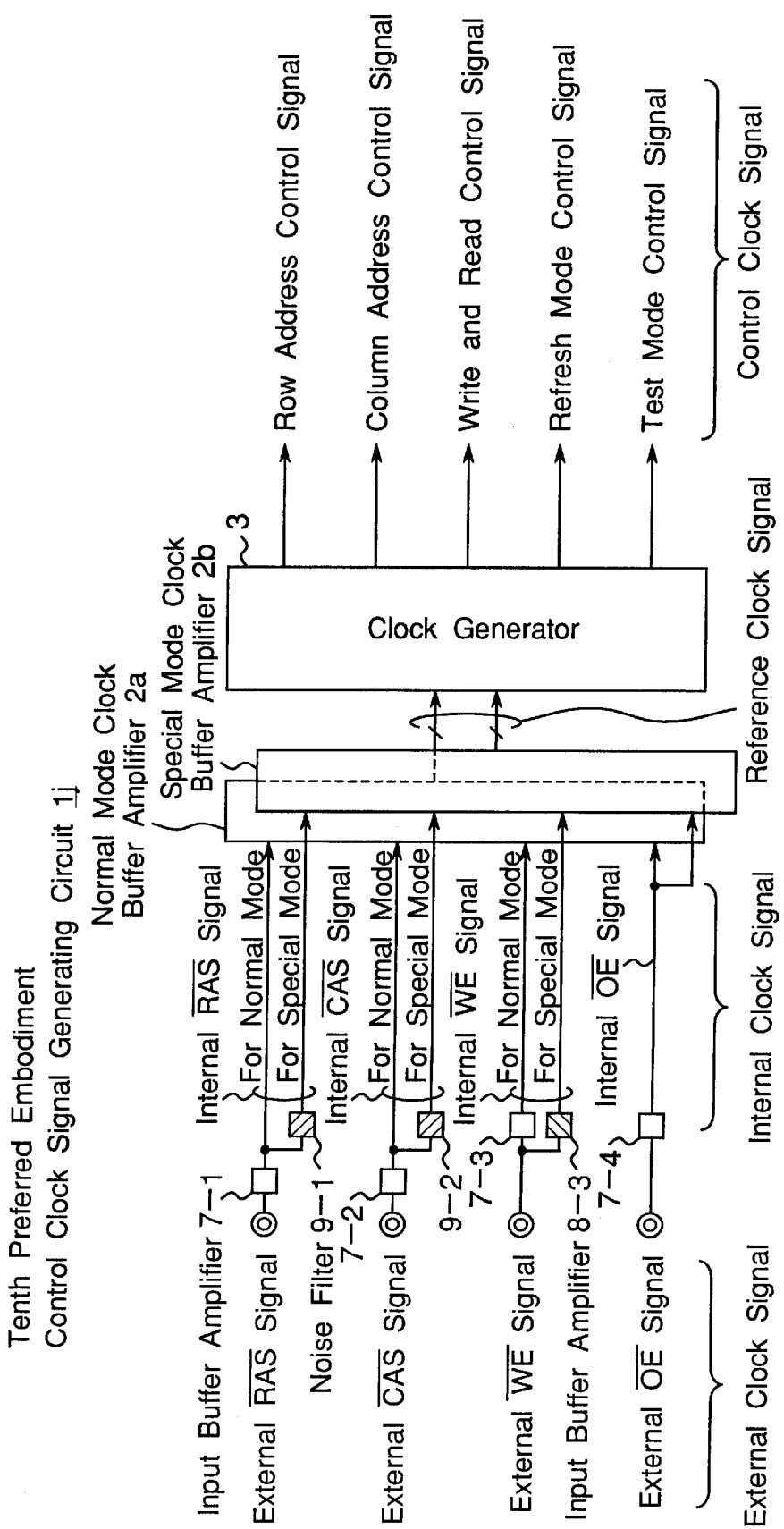
FIG. 10 is a block diagram showing a configuration of a control clock signal generating circuit 1j for a clock asynchronous DRAM of a tenth preferred embodiment according to the invention.

FIG. 10 is a block diagram showing a configuration of a control clock signal generating circuit 1j for a clock asynchronous DRAM of a tenth preferred embodiment according to the invention.

Referring to FIG. 10, the control clock signal generating circuit 1j of the tenth preferred embodiment is characterized by that the special mode input buffer amplifier 8-3 according to the second preferred embodiment of FIG. 2 is further provided for the external $\overline{WE}$ signal, in addition to the configuration of the control clock signal generating circuit 1d according to the fourth preferred embodiment of FIG. 4.

Accordingly, the noise superimposed on the external clock signal such as the external $\overline{RAS}$ signal, the external $\overline{CAS}$ signal and the external $\overline{WE}$ signal can be delayed and reduced, and thus, the influence of the noise can be remarkably reduced. It is therefore possible to reduce, relax or prevent a malfunction due to the noise superimposed on the external clock signal, more particularly, such an entry into the special mode as interrupting the normal mode operation (leading to abnormal stop) such as the read or write operation or the like.

ELEVENTH PREFERRED EMBODIMENT

Figure 11:
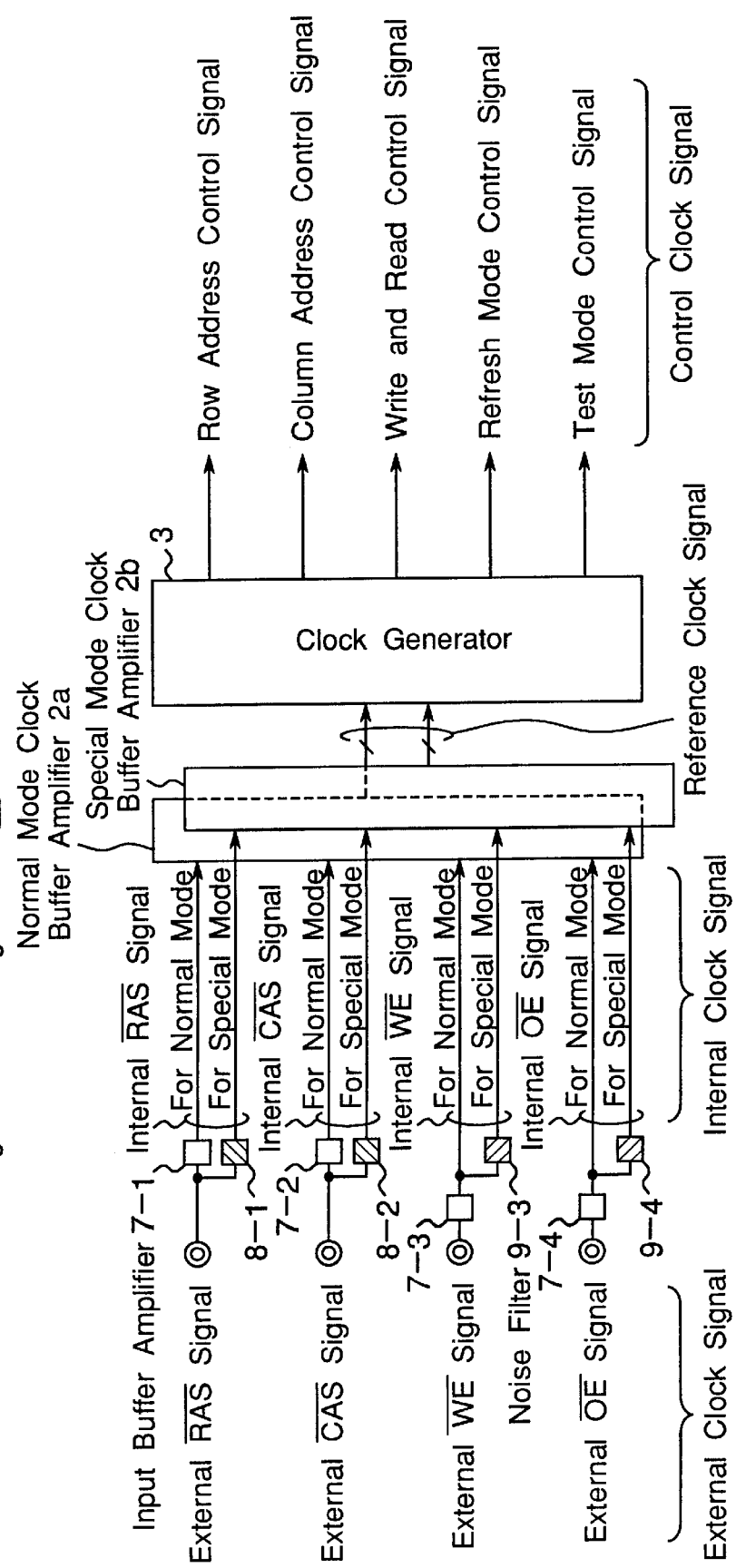
FIG. 11 is a block diagram showing a configuration of a control clock signal generating circuit 1k for a clock asynchronous DRAM of an eleventh preferred embodiment according to the invention.

FIG. 11 is a block diagram showing a configuration of a control clock signal generating circuit 1k for a clock asynchronous DRAM of an eleventh preferred embodiment according to the invention.

Referring to FIG. 11, the control clock signal generating circuit 1k of the eleventh preferred embodiment is characterized by that the noise filter 9-3 according to the sixth preferred embodiment of FIG. 6 is further provided for the external $\overline{WE}$ signal and the noise filter 9-4 according to the sixth preferred embodiment of FIG. 6 is further provided for the external $\overline{OE}$ signal, in addition to the configuration of the control clock signal generating circuit 1a according to the first preferred embodiment of FIG. 1.

Accordingly, the noise superimposed on the external clock signal such as the external $\overline{RAS}$ signal, the external $\overline{CAS}$ signal, the external $\overline{WE}$ signal and the external $\overline{OE}$ signal can be delayed and reduced, and thus, the influence of the noise can be remarkably reduced. It is therefore possible to reduce, relax or prevent a malfunction due to the noise superimposed on the external clock signal, more particularly, such an entry into the special mode as interrupting the normal mode operation (leading to abnormal stop) such as the read or write operation or the like.

TWELFTH PREFERRED EMBODIMENT

Figure 12:
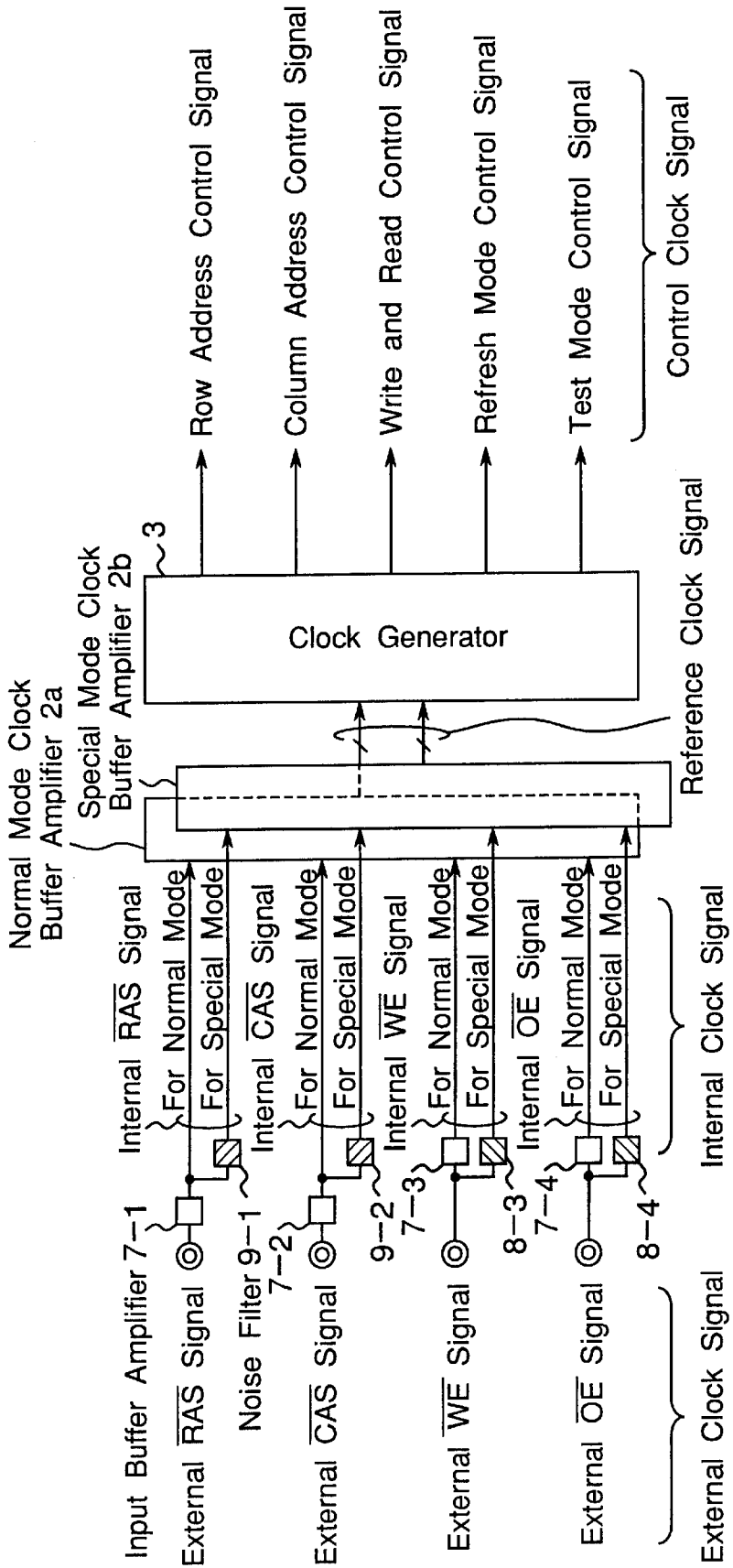
FIG. 12 is a block diagram showing a configuration of a control clock signal generating circuit 1l for a clock asynchronous DRAM of a twelfth preferred embodiment according to the invention.

FIG. 12 is a block diagram showing a configuration of a control clock signal generating circuit 1l for a clock asynchronous DRAM of a twelfth preferred embodiment according to the invention.

Referring to FIG. 12, the control clock signal generating circuit 1l of the twelfth preferred embodiment is characterized by that the special mode input buffer amplifier 8-3 according to the third preferred embodiment of FIG. 3 is further provided for the external $\overline{WE}$ signal and the special mode input buffer amplifier 8-4 according to the third preferred embodiment of FIG. 3 is further provided for the external $\overline{OE}$ signal, in addition to the configuration of the control clock signal generating circuit 1d according to the fourth preferred embodiment of FIG. 4.

Accordingly, the noise superimposed on the external clock signal such as the external $\overline{RAS}$ signal, the external $\overline{CAS}$ signal, the external $\overline{WE}$ signal and the external $\overline{OE}$ signal can be delayed and reduced, and thus, the influence of the noise can be remarkably reduced. It is therefore possible to reduce, relax or prevent a malfunction due to the noise superimposed on the external clock signal, more particularly, such an entry into the special mode as interrupting the normal mode operation (leading to abnormal stop) such as the read or write operation or the like.

MODIFIED PREFERRED EMBODIMENTS

Although the special mode input buffer amplifiers 8-1 to 8-4 and/or the noise filters 9-1 to 9-4 are used in the above-described preferred embodiments, the invention is not limited to these preferred embodiments. In a semiconductor memory device which comprise (a) input buffer amplifiers for converting a plurality of external clock signals into a plurality of internal clock signals each having an internal signal level, respectively, and (b) a signal generating circuit for generating control clock signals for controlling an operation of said semiconductor memory device in accordance with said plurality of internal clock signals, the semiconductor memory device may comprises generating means having a time response characteristic gently changing according to a change in an input signal, where the generating means generates an internal clock signal for a different special mode from a normal mode associated with reading or writing of data from and in the semiconductor memory in accordance with at least one of the plurality of external clock signals. Preferably, the generating means may be provided in the input buffer amplifier. Alternatively, the generating means may be a noise filter provided so as to follow the input buffer amplifier. Alternatively, the generating means may be a combination of them.

Accordingly, the noise superimposed on the external clock signal can be delayed and reduced, and thus, the influence of the noise can be remarkably reduced. It is therefore possible to reduce, relax or prevent a malfunction due to the noise superimposed on the external clock signal, more particularly, such an entry into the special mode as interrupting the normal mode operation (leading to abnormal stop) such as the read or write operation or the like.

More particularly, the above-mentioned noise filter can eliminate both of the positive noise changing in the positive voltage direction and the negative noise changing in the negative voltage direction, which are superimposed on the external clock signal.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor memory device comprising:

input buffer amplifiers for converting a plurality of external clock signals into a plurality of internal clock signals each having an internal signal level, respectively;

a signal generating circuit for generating control clock signals for controlling an operation of said semiconductor memory device in accordance with said plurality of internal clock signals; and generating means having a time response characteristic gently changing according to a change in an input signal, said generating means generating an internal clock signal for a different special mode from a normal mode associated with either one of reading and writing of data from and in said semiconductor memory device in accordance with at least one of said plurality of external clock signals.

2. The semiconductor memory device according to claim 1, wherein said generating means is provided in said input buffer amplifier.

3. The semiconductor memory device according to claim 1, wherein said generating means is a noise filter provided so as to follow said input buffer amplifier, said noise filter delaying the change in the input signal and outputting a delayed signal as an output signal.

4. The semiconductor memory device according to claim 1, wherein said generating means are provided for at least two of said plurality of external clock signals, and wherein one of a plurality of generating means is provided in said input buffer amplifier, while another of said plurality of generating means is a noise filter provided so as to follow said input buffer amplifier.

5. The semiconductor memory device according to claim 1, wherein said plurality of external clock signals include an external $\overline{RAS}$ signal and an external $\overline{CAS}$ signal, and wherein said generating means are provided for said external $\overline{RAS}$ signal and said external $\overline{CAS}$ signal.

6. The semiconductor memory device according to claim 1, wherein said plurality of external clock signals include an external $\overline{RAS}$ signal, an external $\overline{CAS}$ signal and an external $\overline{WE}$ signal, and wherein said generating means are provided for said external $\overline{RAS}$ signal, said external $\overline{CAS}$ signal and said external $\overline{WE}$ signal.

7. The semiconductor memory device according to claim 1, wherein said plurality of external clock signals include an external $\overline{RAS}$ signal, an external $\overline{CAS}$ signal, an external $\overline{WE}$ signal and an external $\overline{OE}$ signal, and wherein said generating means are provided for said external $\overline{RAS}$ signal, said external $\overline{CAS}$ signal, said external $\overline{WE}$ signal and said external $\overline{OE}$ signal.

8. The semiconductor memory device according to claim 5, wherein each of said generating means provided for said external $\overline{RAS}$ signal and said external $\overline{CAS}$ signal is provided in said input buffer amplifier.

9. The semiconductor memory device according to claim 5, wherein each of said generating means provided for said external $\overline{RAS}$ signal and said external $\overline{CAS}$ signal is a noise filter provided so as to follow said input buffer amplifier, said noise filter delaying the change in the input signal and outputting a delayed signal as an output signal.

10. The semiconductor memory device according to claim 5, wherein said generating means provided for said external $\overline{RAS}$ signal is provided in said input buffer amplifier, and wherein said generating means provided for said external $\overline{CAS}$ signal is a noise filter provided so as to follow said input buffer amplifier, said noise filter delaying the change in the input signal and outputting a delayed signal as an output signal.

11. The semiconductor memory device according to claim 5, wherein said generating means provided for said external $\overline{RAS}$ signal is a noise filter provided so as to follow said input buffer amplifier, said noise filter delaying the change in the input signal and outputting a delayed signal as an output signal, and wherein said generating means provided for said external $\overline{CAS}$ signal is provided in said input buffer amplifier.

12. The semiconductor memory device according to claim 6, wherein each of said generating means provided for said external $\overline{RAS}$ signal, said external $\overline{CAS}$ signal and said external $\overline{WE}$ signal is provided in said input buffer amplifier.

13. The semiconductor memory device according to claim 6, wherein each of said generating means provided for said external $\overline{RAS}$ signal, said external $\overline{CAS}$ signal and said external $\overline{WE}$ signal is a noise filter provided so as to follow said input buffer amplifier, said noise filter delaying the change in the input signal and outputting a delayed signal as an output signal.

14. The semiconductor memory device according to claim 6, wherein each of said generating means provided for said external $\overline{RAS}$ signal and said external $\overline{CAS}$ signal is provided in said input buffer amplifier, and wherein said generating means provided for said external $\overline{WE}$ signal is a noise filter provided so as to follow said input buffer amplifier, said noise filter delaying the change in the input signal and outputting a delayed signal as an output signal.

15. The semiconductor memory device according to claim 6, wherein each of said generating means provided for said external $\overline{RAS}$ signal and said external $\overline{CAS}$ signal is a noise filter provided so as to follow said input buffer amplifier, said noise filter delaying the change in the input signal and outputting a delayed signal as an output signal, and wherein said generating means provided for said external $\overline{\text{WE}}$ signal is provided in said input buffer amplifier.

16. The semiconductor memory device according to claim 7, wherein each of said generating means provided for said external $\overline{\text{RAS}}$ signal, said external $\overline{\text{CAS}}$ signal, said external $\overline{\text{WE}}$ signal and said external $\overline{\text{OE}}$ signal is provided in said input buffer amplifier.

17. The semiconductor memory device according to claim 7, wherein each of said generating means provided for said external $\overline{\text{RAS}}$ signal, said external $\overline{\text{CAS}}$ signal, said external $\overline{\text{WE}}$ signal and said external $\overline{\text{OE}}$ signal is a noise filter provided so as to follow said input buffer amplifier, said noise filter delaying the change in the input signal and outputting a delayed signal as an output signal.

18. The semiconductor memory device according to claim 7, wherein each of said generating means provided for said external $\overline{\text{RAS}}$ signal and said external $\overline{\text{CAS}}$ signal is provided in said input buffer amplifier, and wherein each of said generating means provided for said external $\overline{\text{WE}}$ signal and said external $\overline{\text{OE}}$ signal is a noise filter provided so as to follow said input buffer amplifier, said noise filter delaying the change in the input signal and outputting a delayed signal as an output signal.

19. The semiconductor memory device according to claim 7, wherein each of said generating means provided for said external $\overline{\text{RAS}}$ signal and said external $\overline{\text{CAS}}$ signal is a noise filter provided so as to follow said input buffer amplifier, said noise filter delaying the change in the input signal and outputting a delayed signal as an output signal, and wherein each of said generating means provided for said external $\overline{\text{WE}}$ signal and said external $\overline{\text{OE}}$ signal is provided in said input buffer amplifier.

20. A semiconductor memory apparatus comprising:

an input terminal for inputting an external signal;

a first signal generating circuit for generating a first internal signal for use in a first operation mode, said first signal generating circuit being connected through a first signal path with said input terminal; and a second signal generating circuit for generating a second internal signal for use in a second operation mode, said second signal generating ciruit being connected through a second signal path with said input terminal, said second signal path having a response to the external signal delayed from that of said first signal path.

21. A semiconductor memory apparatus as claimed in claim 20, further comprising:

a first input buffer provided in said first signal path; and a second input buffer provided in said second signal path, said second input buffer having a response to the external signal delayed from that of said first input buffer.

22. A semiconductor memory apparatus as claimed in claim 20, further comprising:

common input buffer commonly provided in said first and second signal paths; and a noise filter provided in said second signal path, said noise filter provided between said common input buffer and said second signal generating circuit.

23. A semiconductor memory apparatus as claimed in claim 20, wherein the first operation mode is a normal data read operation mode or a normal data write operation mode, and wherein the second operation mode is an operation mode different from the normal data read operation mode or the normal data write operation mode.

* * * * *